United States Patent [19]
Yagi et al.

[11] Patent Number: 4,750,263
[45] Date of Patent: * Jun. 14, 1988

[54] METHOD OF AND APPARATUS FOR SUPPLYING AND TRANSFERRING ELECTRONIC COMPONENTS

[75] Inventors: Hiroshi Yagi; Tetsuro Ito; Yoshio Harada, all of Tokyo, Japan

[73] Assignee: TDK Corporation, Japan

[*] Notice: The portion of the term of this patent subsequent to Sep. 9, 2003 has been disclaimed.

[21] Appl. No.: 741,303

[22] Filed: Jun. 4, 1985

[30] Foreign Application Priority Data

| Jun. 14, 1984 | [JP] | Japan | 59-122852 |
| Jun. 28, 1984 | [JP] | Japan | 59-97327 |
| Jun. 28, 1984 | [JP] | Japan | 59-97328 |
| Jul. 13, 1984 | [JP] | Japan | 59-105177 |
| Jul. 13, 1984 | [JP] | Japan | 59-105178 |
| Jul. 31, 1984 | [JP] | Japan | 59-116215 |
| Aug. 20, 1984 | [JP] | Japan | 59-171649 |
| Sep. 20, 1984 | [JP] | Japan | 59-195829 |

[51] Int. Cl.[4] ............................. H05K 3/32
[52] U.S. Cl. .................... 29/837; 29/564.6; 29/741; 140/105; 198/378
[58] Field of Search ............. 29/564.6, 564.7, 564.8, 29/564.1, 566.2, 33 M, 834, 741, 759, 835–839; 414/223; 198/375, 377, 378; 140/105

[56] References Cited

U.S. PATENT DOCUMENTS

| 4,051,593 | 10/1977 | Mori et al. | 29/564.6 |
| 4,244,101 | 1/1981 | Talley | 29/759 |
| 4,263,708 | 4/1981 | Takahashi et al. | 29/564.6 |
| 4,293,999 | 10/1981 | Woodman | 29/564.6 |
| 4,344,219 | 8/1982 | Tanabe et al. | 29/564.6 |
| 4,403,723 | 9/1983 | Dean et al. | 29/564.6 |

Primary Examiner—William R. Briggs
Attorney, Agent, or Firm—Steinberg & Raskin

[57] ABSTRACT

Apparatus for supplying and transferring electronic components includes a plurality of pallets each for receiving and holding one electronic component. An endless conveying mechanism conveys the pallets in and intermittent fashion on a substantially horizontal plane. A supply unit mechanism selectively supplies electronic components to the pallets.

12 Claims, 47 Drawing Sheets

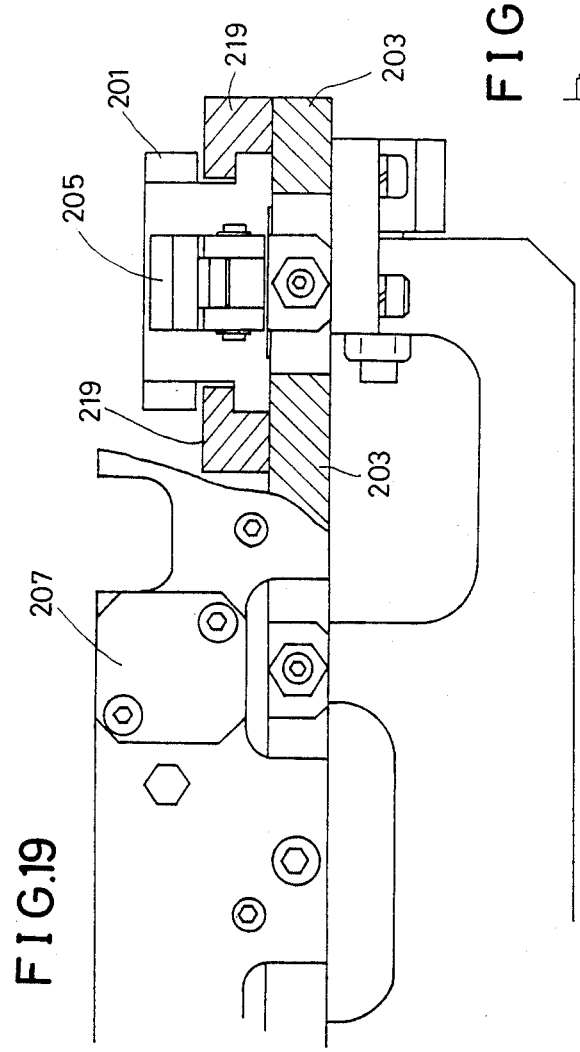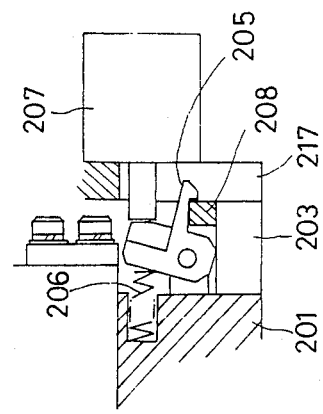

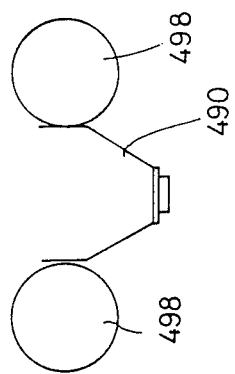
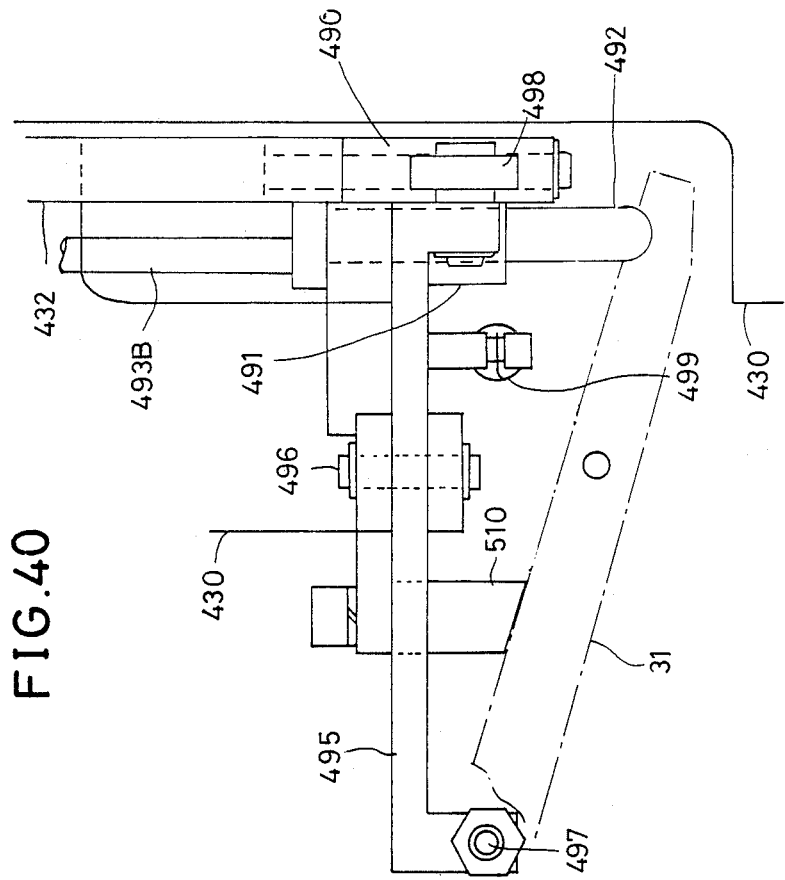

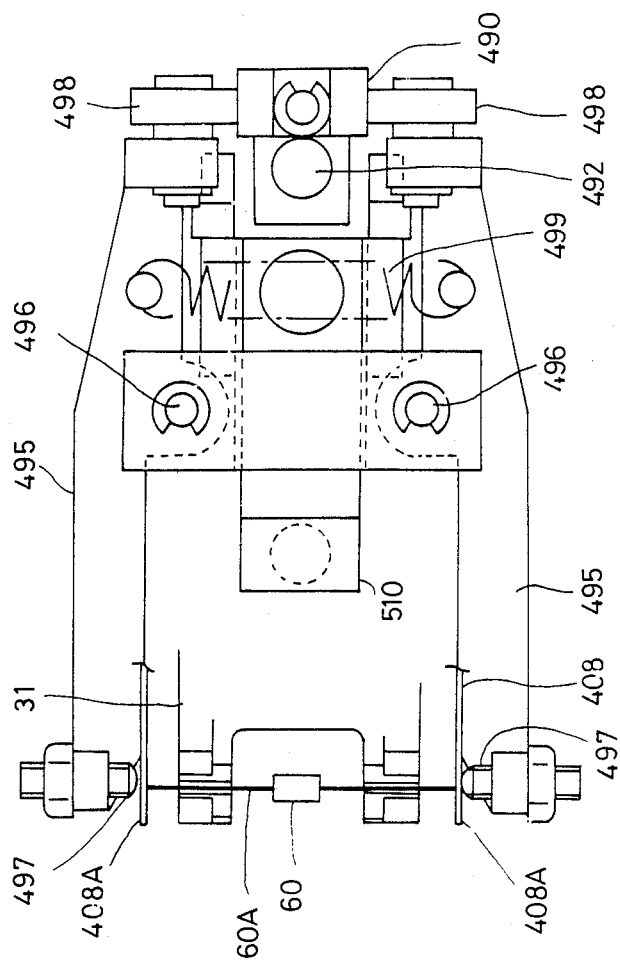

METHOD OF AND APPARATUS FOR SUPPLYING AND TRANSFERRING ELECTRONIC COMPONENTS

BACKGROUND OF THE INVENTION

The present invention relates to method of and apparatus for supplying and transferring electronic components. More particularly, the invention relates to a method and apparatus for supplying and transferring electronic components in an automatic inserting machine by which electronic components having leads are inserted into receiving openings of a printed circuit board. Separated pieces of electronic component web carriers obtained by cutting and separating those which are selected as required from a plurality of electronic component web carriers and each having one electronic component, hereinafter referred to as "separated piece", are received and held by pallets and transferred to an inserting assembly in a subsequent process. A chuck may be utilized, for example, for gripping the electronic component.

The prior art of this application is disclosed in the U.S. patent application Ser. No. 553,681 filed Nov. 21, 1983 now U.S. Pat. No. 4,610,280.

The supply and transfer apparatus of said prior art comprises a plurality of pallets, each for receiving and holding one electronic component. An endless conveying mechanism conveys the pallets in an intermittent fashion on a substantially horizontal plane. A supply unit selectively supplies electronic components to the pallets.

The present invention is intended to improve the prior art.

SUMMARY OF THE INVENTION

An object of the present invention is to provide an electronic component supply and transfer apparatus capable of transferring radial or coaxial lead type electronic components, keeping them as unchangeable in their attitude as possible, while pallets are intermittently travelled and speeding up the component transfer speed with higher reliability.

Another object of the present invention is to provide an electronic component supply and transfer apparatus capable of supplying the radial or coaxial lead type electronic components to the pallets with reliability.

Another object of the present invention is to provide an electronic component supply and transfer apparatus capable of exactly correcting the horizontal and vertical positions of each of the radial lead type electronic components held by the pallets.

The supply and transfer apparatus of the present invention comprises a plurality of pallets, each for receiving and holding one electronic component. An endless conveying mechanism conveys the pallets in an intermittent fashion on a substantially horizontal plane between a first position and a second position. A supply unit selectively supplies electronic components to the pallets.

In a case where the electronic components are of the radial lead type, each of the pallets has a pallet base and component holding means, turnable with respect to said pallet base, for gripping a radial lead type electronic component.

The apparatus of the present invention includes supply means for supplying a separated piece of the radial lead type electronic component, which is cut off from a radial lead type electronic component web carrier, to the component holding means at the first position, keeping the face of said separated piece vertical to the pallet travelling direction and leads of the component vertical to horizontal plane.

In a case where the electronic components are of the coaxial lead type, each of the pallets has a pallet base and a component receiving jig arranged, freely movable up and down at the front ends thereof, at the pallet base and serving to support a coaxial lead type electronic component horizontal but parallel to the pallet travelling direction.

The apparatus of the present invention further includes attitude control means for rotating by 90° on a horizontal plane at the second position the component holding means, which grips the radial lead type electronic component, to hold the face of said separated piece parallel to the pallet travelling direction and rotating the component holding means again on the way on which the pallet passes over the second position and returns to the first position so as to return its attitude to its original one at the first position.

BRIEF DESCRIPTION OF THE DRAWINGS

FIG. 19 is a view viewed from the back side of the mechanism shown in FIG. 18.

FIG. 20 is a sectional side view showing the arrangement of the slider back end.

FIG. 40 is a front view showing the arrangement of a push rod for operating the pallet.

FIG. 41 is a side view showing a tapered cam.

FIG. 42 is a plan view showing a mechanism for positioning the coaxial lead type electronic component held by a component receiving jig.

DESCRIPTION OF THE PREFERRED EMBODIMENTS

Figure 1:
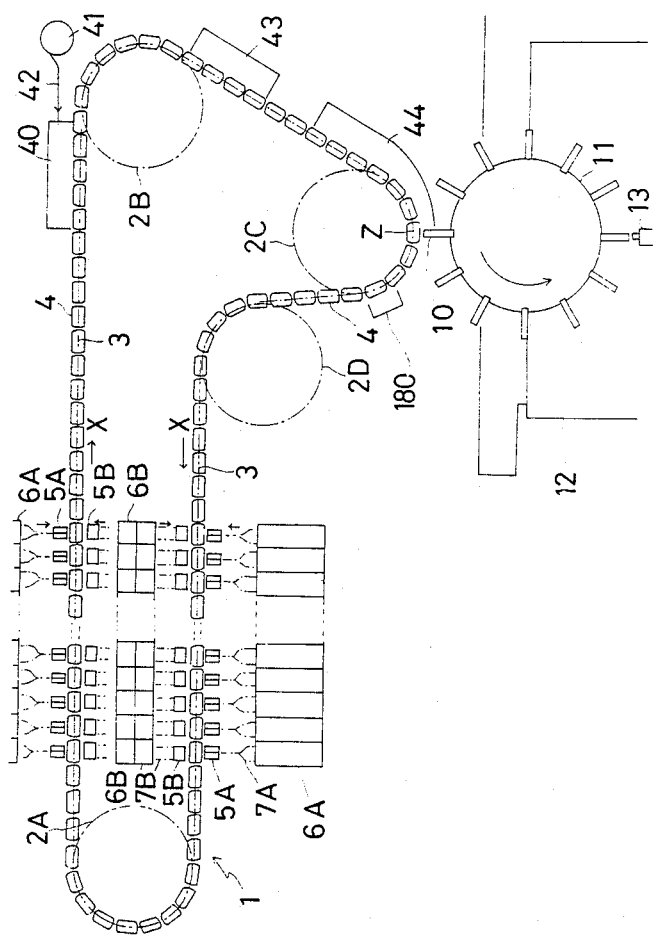
FIG. 1 is a plan view showing the whole arrangement of an example of the electronic component supply and transfer machine according to the present invention.
Figure 2:
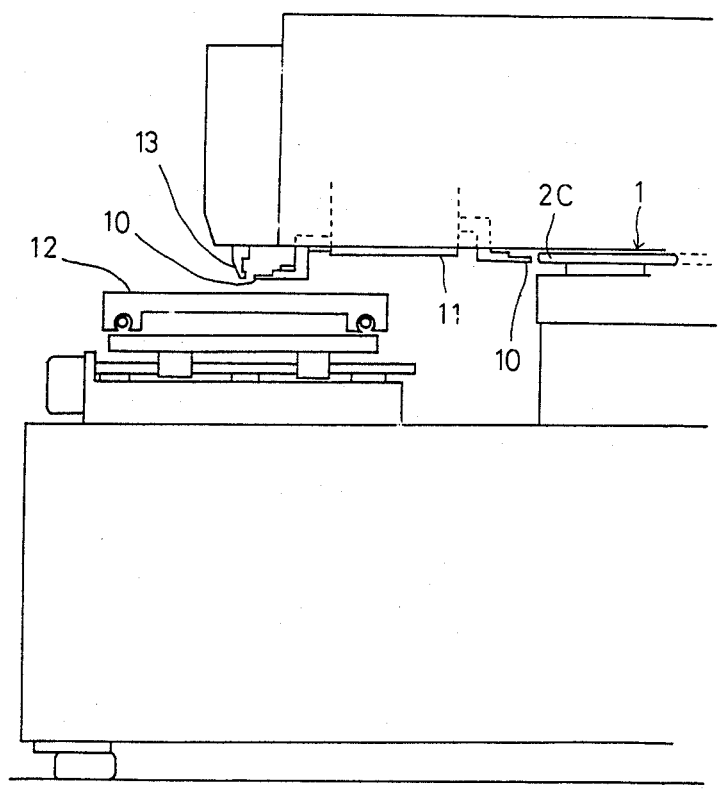
FIG. 2 is a side view roughly showing the machine in FIG. 1.
Figure 3:
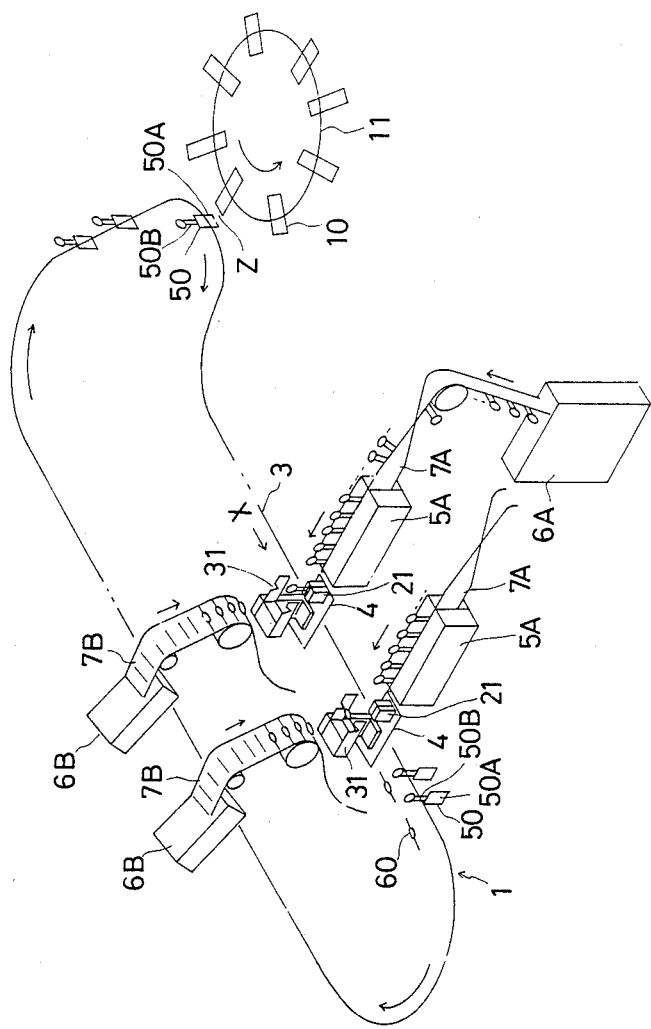
FIG. 3 is a perspective view roughly showing the whole operation of the machine in FIG. 1.

Referring now to the drawings wherein similar or corresponding components are represented by like reference numerals throughout different figures, FIGS. 1 through 3 show the entire structure of an electronic component supply and transfer apparatus of the present invention using pallets for transferring electronic components incorporated in an automatic inserting assembly. As shown in FIGS. 1 through 3, the electronic component supply and transfer apparatus 1 is provided with an endless conveying mechanism travelling on a substantially horizontal plane in an intermittent fashion and composed of a chain 3 extending round sprockets 2A, 2B, 2C and 2D. Pallets 4 are affixed to the chain 3 at a constant pitch for transferring electronic components. Each pallet 4 holds a separated piece of coaxial lead type electronic component web carrier, hereinafter referred to as a "separated coaxial piece", or a separated piece of radial lead type electronic component web carrier, hereinafter referred to as a "separated radial piece", obtained by cutting and separating a coaxial or radial lead type electronic component web carrier, respectively, so that each separated piece possesses a piece of electronic component.

Supply units 5A are arranged at an interval, equal to that between the pallets 4, along a straight path along which the chain 3 travels together with the pallets 4. A radial lead type electronic component web carrier 7A drawn from a package 6A which rotatably houses a reel on which the electronic component web carrier is wound is connected to each of the supply units 5A. The packages 6A are arranged at same interval as that between the supply units 5A in this case, and the radial lead type electronic component web carrier 7A which has been drawn from the package 6A is twisted by 90°, changing its horizontal state to vertical state, and delivered to the radial lead type electronic component supply unit 5A, as shown in FIG. 3.

Similarly, axial lead type electronic component supply units 5B are arranged at an interval, equal to that between the pallets 4, along the straight path along which the pallets 4 travel, but opposite to the radial lead type electronic component supply units 5A, with the straight path interposed between them. A coaxial lead type electronic component web carrier 7B drawn from a package 6B which houses the coaxial lead type electronic component web carrier 7B is connected, as it is without being twisted, to each of the axial lead type electronic component supply units 5B.

In addition to the electronic component supply and transfer apparatus 1, the automatic inserting machine includes a circulating chuck mechanism 11 in which chucks 10 each gripping a cut piece of the radial lead type electronic component web carrier transferred or an coaxial lead type electronic component which has been formed or bent to have radial leads are arranged at a same interval. The automatic inserting machine also includes a guide 13 for inserting the leads of the electronic component transferred by the chuck 10 into a printed circuit board on an XY table 12.

Figure 4:
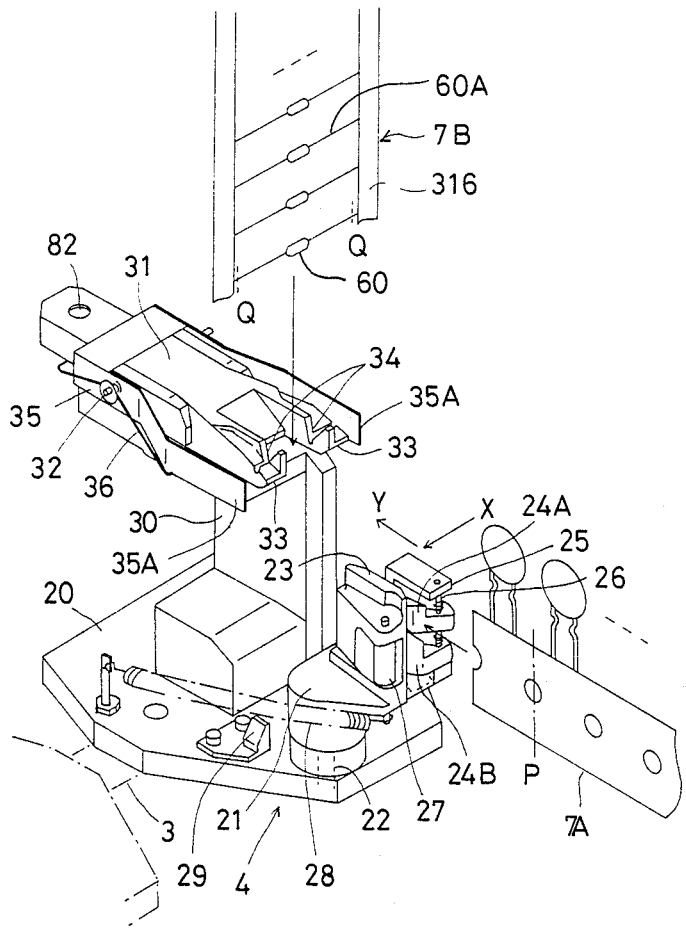
FIG. 4 is a perspective view showing a pallet ready for a radial or axial lead type electronic component supplied.
Figure 5:
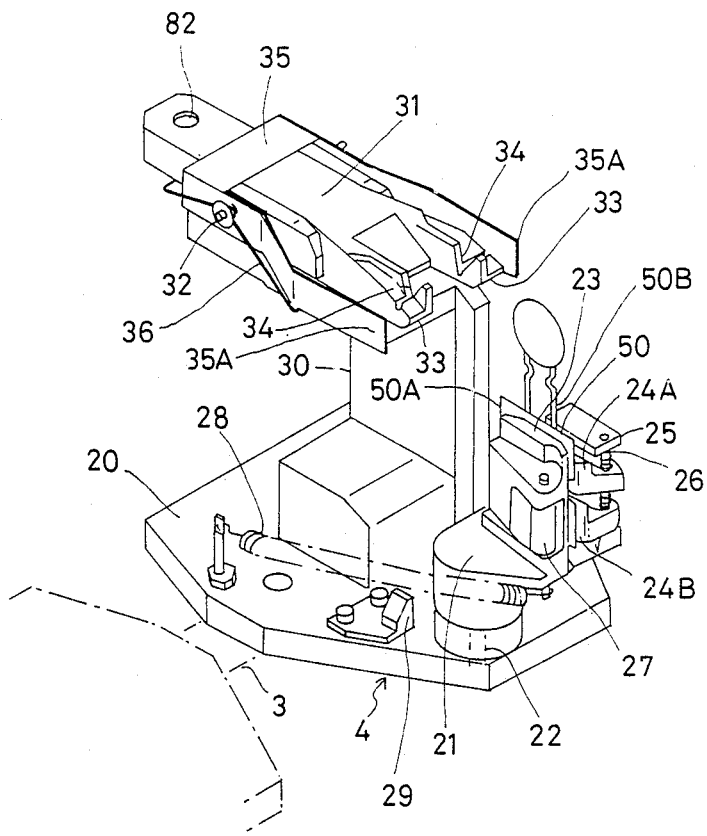
FIG. 5 is a perspective view showing the pellet holding a radial lead type electronic component piece.
Figure 6:
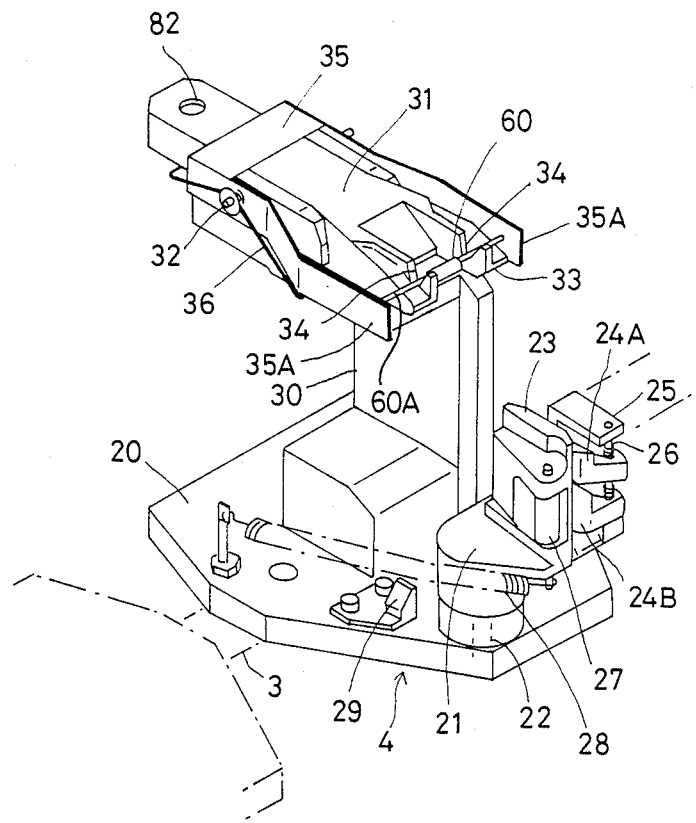
FIG. 6 is a perspective view showing the pallet holding a coaxial lead type electronic component.
Figure 7:
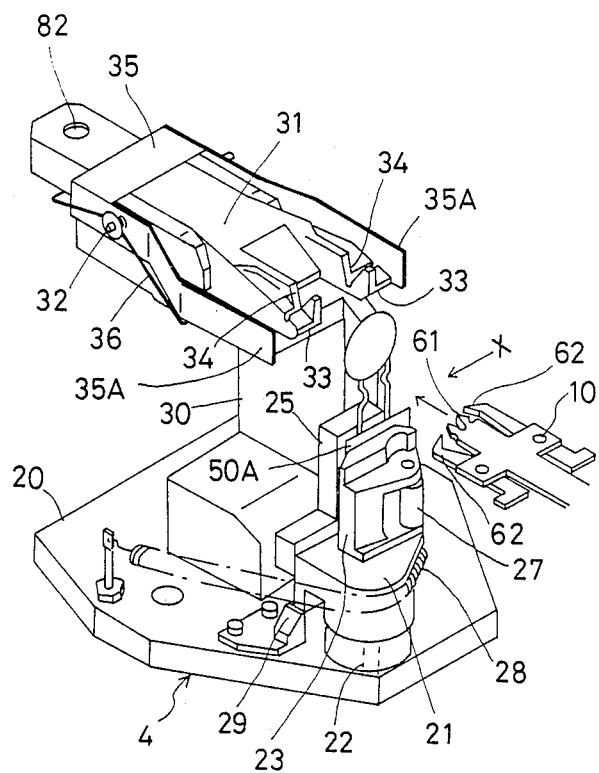
FIG. 7 is a perspective view showing the pallet at a position where the electronic component is shifted to a chuck.

The pallets 4 in the electronic component supply and transfer apparatus 1 are shown in detail in FIGS. 4 through 7. FIG. 4 shows the state under which the pallet 4 is ready for receiving the radial or coaxial lead type electronic component web carrier 7A or 7B supplied. FIG. 5 shows a piece 50 of the radial lead type electronic component web carrier held by the pallet 4, said piece 50 being cut and separated from the radial lead type electronic component 7A along a dot-and-dash line P in FIG. 4 to have an electronic component therewith. FIG. 6 shows an coaxial lead type electronic component 60 mounted on the pallet 4, said axial lead type electronic component 60 being cut and separated from the axial lead type electronic component web carrier 7B along a dot-and-dash line Q in FIG. 4. FIG. 7 shows the pallet 4 positioned opposite to the chuck 10 of the circulating chuck mechanism 11.

In FIGS. 4 through 7, the pallet 4 is fixed to the chain 3 at its base 20, and a radial lead type electronic component holder 21 is mounted on the pallet base 20 at the front portion thereof in such a manner that the holder 21 can rotate on a horizontal plane, taking a vertical rod 22 as its fulcrum. The holder 21 includes a fixed holder guide 23 erected integral to the holder 21, and holding claws 24A, 24B forced against a face of this holder guide 23. The radial lead type electronic component piece 50 is held by the holder guide 23 and the holding claws 24A, 24B. These holding claws 24A and 24B are freely rotatably attached to a rod 26 supported by a frame 25, and they are urged against the face of the holder guide 23 by means of springs attached to the rod 26. A roller 27 is arranged at the front end portion of the outer face of the fixed holder guide 23. The holding claws 24A and 24B are different in shape and dimension so as to hold the radial lead type electronic component piece 50 at different positions thereof. An underside 23A of the fixed holder guide 23 shown in FIG. 8 serves to define the lower end of the radial lead type electronic component piece 50. An expandable spring 28 is stretched between the holder 21 and the pallet base 20 to pull the holder 21 in the clockwise direction.

Figure 8:
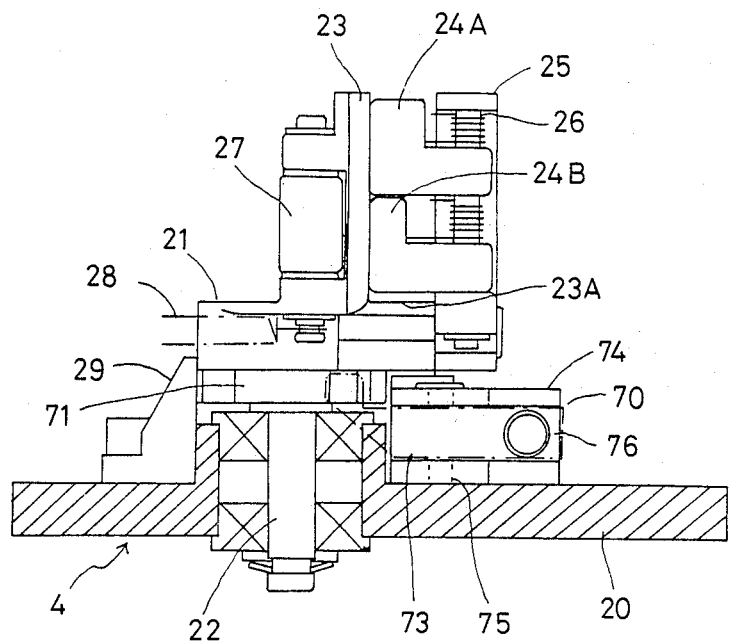
FIG. 8 is a front view, partially sectioned, showing a component holder on the pallet.
Figure 9:
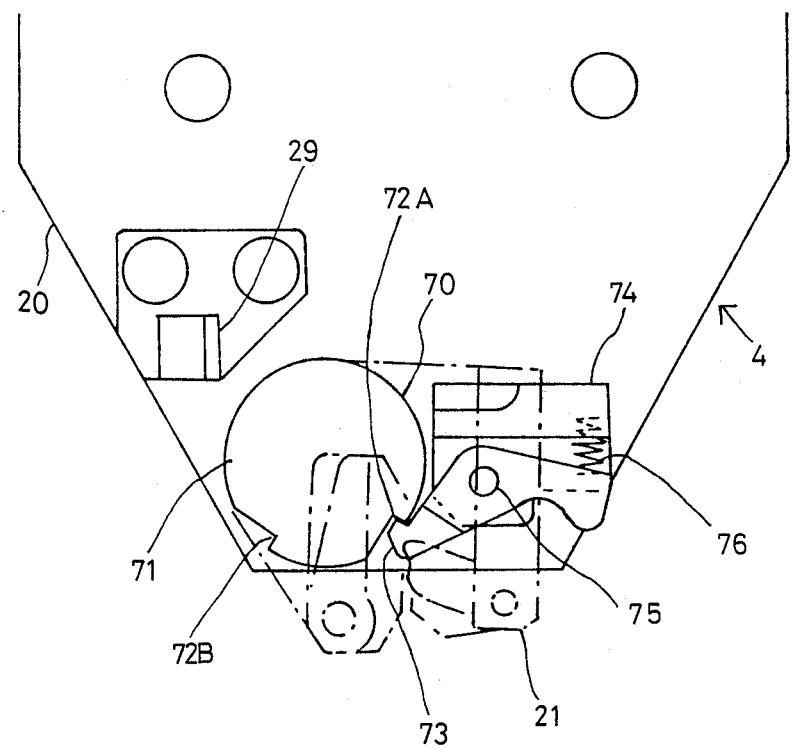
FIGS. 9 and 10 are plan views showing a ratchet mechanism arranged at the pallet.
Figure 10:
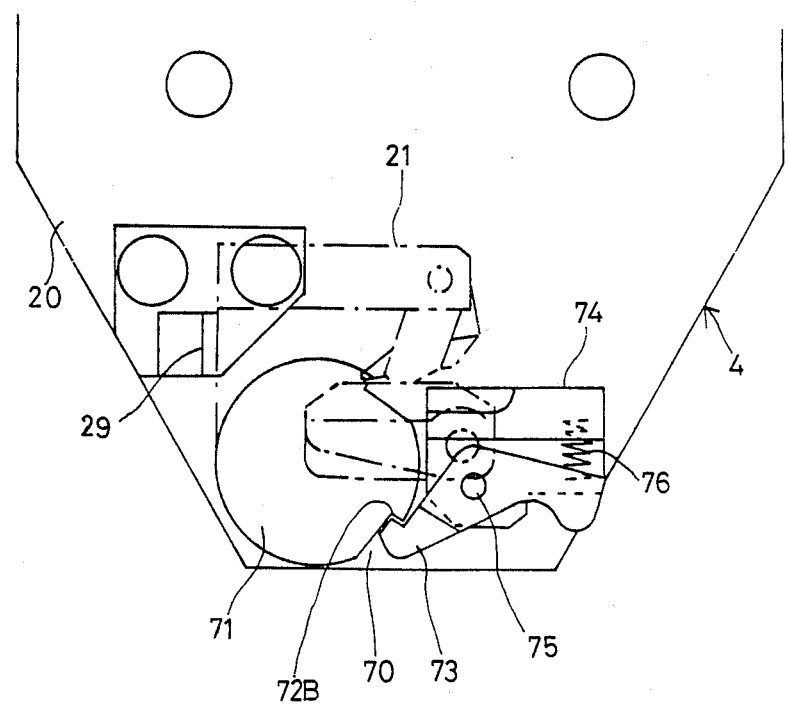

As shown in FIGS. 8 through 10, the range in which the holder 21 is allowed to rotate is limited to 90° by means of a ratchet mechanism 70 arranged under the holder 21 and a position determining stopper 29 fixed onto the pellet base 20, ranging from the state under which the holding guide face of the fixed holder guide 23 is directed parallel to a direction Y which is perpendicular to a pallet travelling direction X, as shown in FIG. 4, to the state under which it is directed substantially parallel to the pallet travelling direction X, as shown in FIG. 7.

The ratchet mechanism 70 is provided with a disk 71 rotatable round the vertical rod 22 which is fixed to the underside of the component holder 21, and a pawl-shaped lever 73 engageable with notches 72A, 72B which are provided on the circumference of the disk. The pawl-shaped lever 73 is pivoted on a metal base 74, which is fixed to the pallet base 20, by means of a pin 75. A compression spring 76 is interposed between the back end of the pawl-shaped lever 73 and the metal base 74. When the electronic component web carrier is normally being transferred, the pawl-shaped lever 73 is engaged with the notch 72A, as shown in FIG. 9, to define the position of the component holder 21, as shown in FIG. 4.

Figure 11:
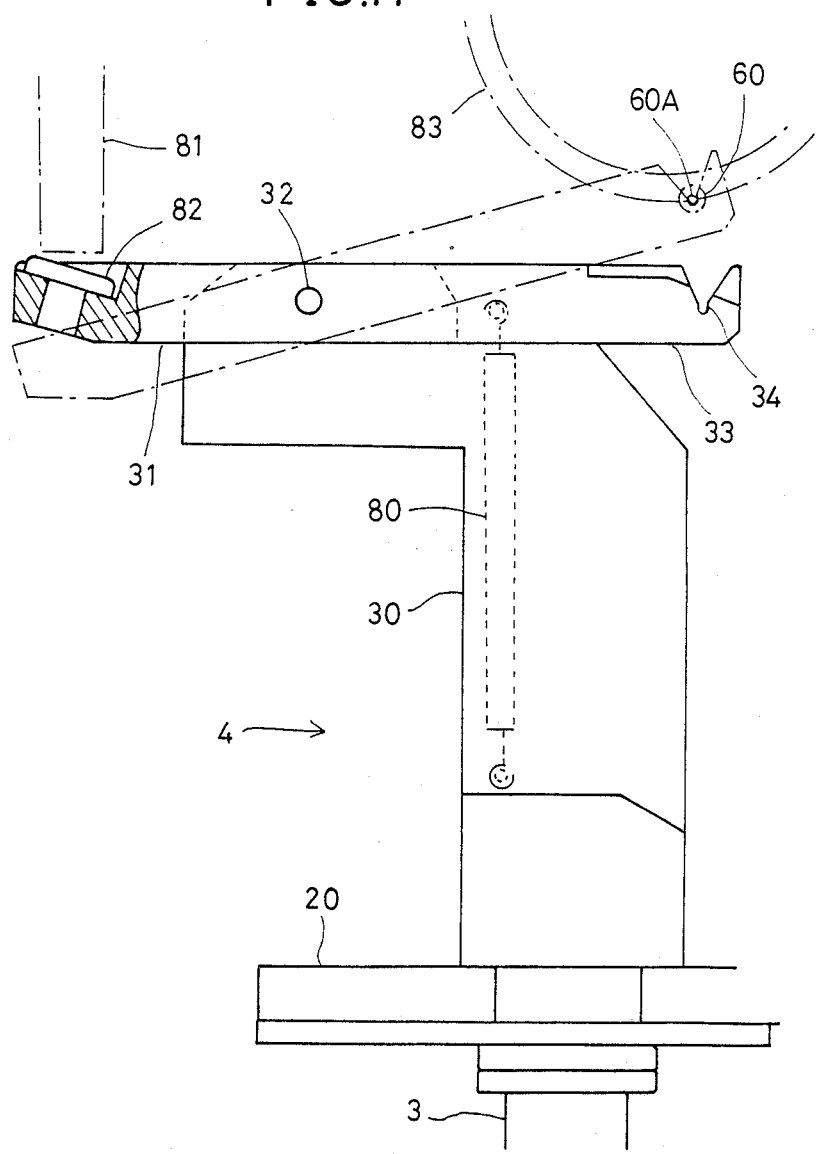
FIG. 11 is a side view showing a mount on which the coaxial lead type electronic component is mounted.

A support 30 is fixed onto the pallet base 20 at the back of the component holder 21 and a mount 31 on which the coaxial lead type electronic components are mounted is pivoted on the support by means of a pin 32, as shown in FIG. 11. The mount 31 has a pair of arms 33, which are provided with V-shaped recesses 34, respectively, to receive the leads of an axial lead type electronic component 60 separated from the axial lead type electronic component web carrier 7B. Since the mount 31 is pivoted on the support 30 by the pin 32, the paired arms 33 which form the front end of the mount 31 are lifted when the back end of the mount 31 is pushed down. However, the mount 31 is horizontal, closely contacting with the support 30, by means of an expandable spring 80 under the state of normally transferring the coaxial lead type electronic component web carrier. Attached to the pin 32 is a leaf spring stopper 35, which is urged by a spring 36 to lift its front end. The position of the leaf spring stopper 35 is limited in such a way that its back portion is contacted with the upper face of the mount 31, while its front end portions 35A are positioned outside the paired arms 33 of the mount 31, respectively, to define the front ends of the leads of the coaxial lead type electronic component 60.

In FIG. 1, reference numeral 44 represents an attitude control mechanism for rotating the holder 21, which has gripped the radial lead type electronic component 50, by 90° when the pallet 4 reaches a position Z. The attitude control mechanism 44 is shown in detail in FIG. 12. The attitude control mechanism 44 has cams 44A, 44B and 44C contacted with the roller 27 in the holder 21 of the pallet 4, wherein the cams 44A and 44B are fixed to the table of the electronic component supply and transfer apparatus, while the cam 44C is urged against the roller 27 by means of a compression spring 45 to reliably rotate by 90° the holder 21 on the pallet which is at the position Z.

As shown in FIG. 1, an attitude return mechanism 180 for returning the holder 21 to its original attitude is arranged at a position following the attitude control position Z, and the holder 21 is returned to its original attitude, ready for a next electronic component, by this attitude return mechanism 180.

Figure 13:
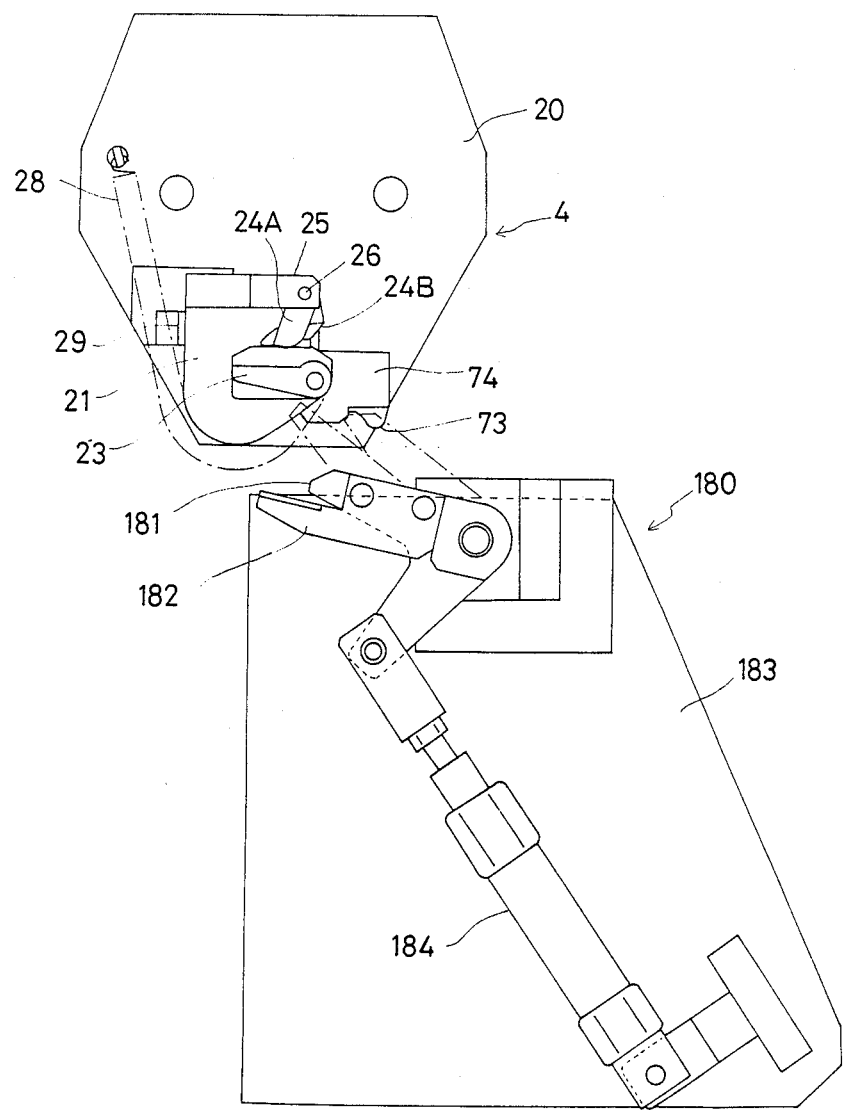

The attitude return mechanism 180 serves to release the ratchet mechanism 70 when the pallet 4 passes through the attitude control position Z and then reaches a position remote from the circulating chuck mechanism 11 (or a position at which a sprocket 2C is rotated by 30°-45° from the attitude control position Z, for example). As shown in FIG. 13, therefore, the attitude return mechanism 180 includes a ratchet releasing lever 181 and a detent lever 182 fixed onto the ratchet releasing lever 181. The ratchet releasing lever 181 is pivoted on a support plate 183 fixed to the table of the electronic component supply and transfer apparatus, and an air cylinder 184 is arranged between the back end of the lever 181 and the support plate 183. When the cylinder 184 is extended, the front end of the ratchet releasing lever 181 is forwarded to push the back end of the pawl-shaped lever 73 on the side of the ratchet mechanism and release it from the notch 72B. The detent lever 182 prevents the component holder 21 from being rapidly returned, and it contacts the roller 27 to put the holder 21 under normal transfer condition, as shown in FIG. 4, following the return of the cylinder 184.

In FIG. 1, reference numeral 40 denotes a jumper mechanism, which cuts a jumper of certain length from a jumper line 42 drawn from a jumper line reel 41 and locates it on the mount 31 of the pallet 4 as in the case of the coaxial lead type electronic component 60. Reference numeral 43 represents a correction mechanism for correcting the position of an electronic component on every pallet.

The electronic component transfer pallets 4 are travelled in the intermittent manner by the intermittently-rotating movement of the sprockets 2A-2D. When each of the pallets 4 is position between the supply units 5A and 5B, or when it is made ready, as shown in FIG. 4, the predetermined one of the radial and coaxial lead type electronic component web carriers 7A and 7B is selected and then cut at either of the supply units 5A and 5B. In the case of the radial lead type electronic component web carrier selected, it is cut as the radial lead type electronic component piece 50, which is shifted to the component holder 21 of the pallet 4, as shown in FIG. 5. The radial lead type electronic component piece 50 is held between the guide face of the fixed holder guide 23 of the holder 21 and the holding claws 24A, 24B. In the case of the coaxial lead type electronic component web carrier selected, it is cut along its lead line as the axial lead type electronic component 60, which is held in the V-shaped grooves 34 of the mount 31, as shown in FIG. 6. More specifically, a metal seat 82 at the back end of the mount 31 is pushed down by a push rod 81, while the V-shaped grooves 34 at the front end of the mount 31 are raised to receive leads of the coaxial lead type electronic component 60 located on the side of a pitch feeding unit 83 of the supply unit 5B, as shown in FIG. 11. The coaxial lead type electronic component 60 is cut and separated from the coaxial lead type electronic component web carrier 7B under this state, thereby enabling the coaxial lead type electronic component 60 to be shifted from the supply unit 5B to the grooves 34 of the mount 31.

The radial and coaxial lead type electronic component web carriers are supplied in this case in such an order that the radial and coaxial lead type electronic components 50 and 60 are put onto the pallets 4 following the order of them to be inserted into the printed circuit board.

Holding one of the radial and coaxial lead type electronic components 50 and 60 (but leaving empty those pallets on which the jumpers are to be put), each of the pallets 4 is travelled toward the sprocket 2C where the chucks 10 of the circulating chuck mechanism 11 are arranged. Under this normal travel of the pallets, the component holder 21 of each pallet 4 is held by the ratchet mechanism 70 shown in FIG. 9 in such a way that the the holding guide face of its fixed holder guide 23 is vertical, i.e. perpendicular in relation to the direction X in which the pallets 4 are travelled. As apparent from FIG. 3, therefore, the radial lead type electronic component piece 50 is travelled in such a way that its tape face 50A is held vertical in relation to the pallet travelling direction while its leads 50B are held vertical in relation to a horizontal plane which is regarded as the pallet travelling plane.

The coaxial lead type electronic component 60 is travelled, parallel to the pallet travelling direction. In this while, however, it is controlled to be at its predetermined position by the action of the leaf spring stopper 35 whose front portions are arranged outside the both sides of the mount 31.

Figure 12:
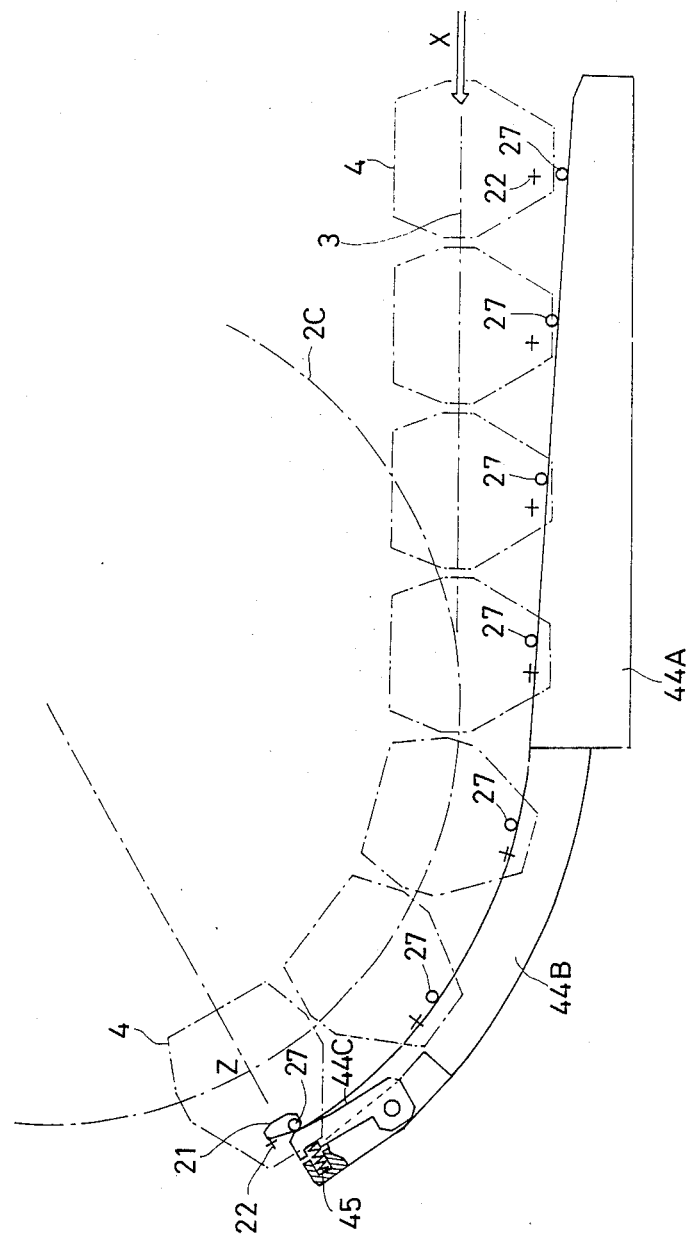
FIGS. 12 and 13 are plan views showing a mechanism for controlling the rotating position of a means which holds the radial lead type electronic component.

Those pallets 4 to which the jumpers 42 have been supplied by the jumper mechanism 40 and which have been corrected about their component position by the correction mechanism 43 approach the attitude control mechanism 44 arranged adjacent to the sprocket 2C. The roller 27 in the holder 21 of each pallet 4 is then gradually rotated in anti-clockwise direction by the attitude control mechanism 44, taking the vertical rod 22 as its fulcrum, as shown in FIG. 12. The component holder 21 of the pallet 4 is rotated just by 90° and positioned as shown in FIG. 7 at the component shift position Z where the pallet 4 is held opposite to the chuck 10 of the circulating chuck mechanism 11. The component holder 21 is controlled in position by the stopper 29, as shown in FIG. 10, and the ratchet mechanism 70 is rendered operative in such a way that its pawl-shaped lever 73 is about to be engaged with the notch 72B. This engagement of the ratchet mechanism 70 is held for a while, even after the pallet 4 passes over the component shift position Z, until the ratchet mechanism 70 is released by the return mechanism 180, thereby allowing the circulating chuck mechanism 11 to be rotated. The tape face 50A of the radial lead type electronic component piece 50 is substantially parallel to the pallet travelling direction X while its two leads 50B are vertically erected with a certain interval between them at the component shift position Z. The chuck 10 is forwarded this time in a direction shown by an arrow in FIG. 7, gripping the leads between its fixed and movable claws 61 and 62 and then picking up the radial lead type electronic component piece 50 from the component holder 21 as the circulating chuck mechanism 11 is rotated in anti-clockwise direction.

Figure 14:
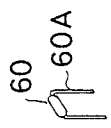
FIG. 14 is a perspective view showing the leads of the coaxial lead type electronic component bent to those of the radial lead type.
Figure 16:
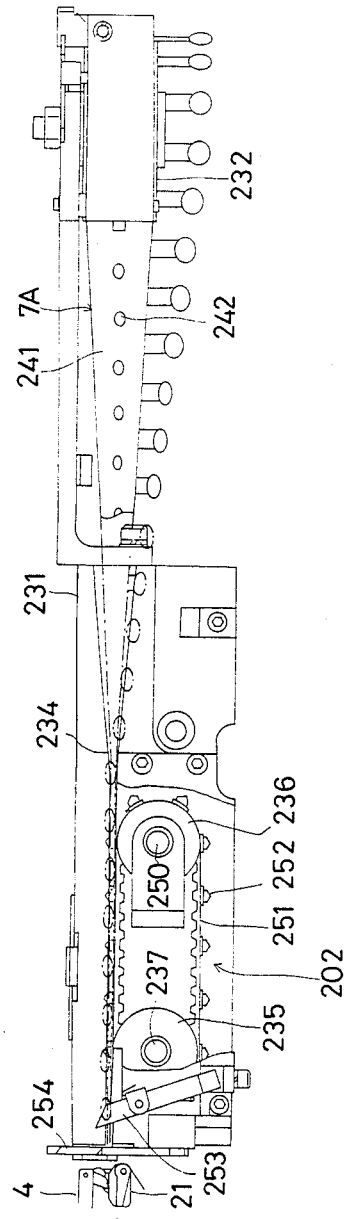
FIG. 16 is a plan view showing the component supplying unit.

In the case of the axial lead type electronic component 60, its leads 60A are re-formed to those of the radial lead type by the forming mechanism, as shown in FIG. 14, and then shifted to the chuck 10.

The chuck mechanism 11 circulates on a horizontal plane to supply the electronic components to the insertion guide 13 after their tape portions are cut off in the case of the radial lead type electronic component pieces 50 or as they are in the case of the coaxial lead type ones. The electronic component thus supplied to the insertion guide 13 is inserted into the printed circuit board on the XY table 12 by means of the insertion guide 13.

After the pallet 4 which has passed over the component shift position Z travels a predetermined distance, it reaches a position at which it is held opposite to the release mechanism 180 shown in FIG. 13 where the ratchet mechanism 70 is released. More specifically, the cylinder 184 is extended and the front end of the ratchet releasing lever 181 is thus forwarded to push the back end of the pawl-shaped lever 73 arranged on the side of the pallet, thereby disengaging the pawl-shaped lever 73 from the notch 72B. The detent lever 182 prevents the component holder 21 from being rapidly returned. In other words, it is contacted with the roller 27 to slowly return the component holder 21 to such normally-travelling state as shown in FIG. 4, following the return of the cylinder. This is intended to prevent the ratchet mechanism 70 from being worn.

The effects achieved by the above-described embodiment are as follows:

(1) Except the area adjacent to the component shift position where the electronic components are shifted to the chucks 10, the pallets 4 are travelled, keeping the tape faces of their radial lead type electronic component pieces 50 vertical to the pallet travelling direction. Even when they are intermittently travelled at a high speed, therefore, they can seldom be shifted in position, thereby enabling the pallets to be travelled at a higher speed and the reliability of the apparatus to be enhanced.

(2) The radial lead type electronic component piece 50 can be held to have an attitude suitable for being shifted to the chuck 10 at the component shift position where the component piece is shifted to the circulating chuck mechanism 11. In other words, its tape face can be held substantially parallel to the pallet travelling direction while keeping its leads erected vertically. The chuck 10 is not needed therefore to have a specific structure and the chuck mechanism 11 can be designed to circulate on a horizontal plane. In addition, the attitude change of the radial lead type electronic component piece 50 on the pallet is carried out, taking as its fulcrum the vertical rod 22 which is adjacent to the center axis of the component piece, thereby making it rare for the component piece to be shifted in position by its attitude change (or the rotation of the component holder 21).

(3) The pallet 4 is provided with the mount 31 on which the axial lead type electronic component 60 cut and separated from the coaxial lead type electronic component web carrier 7B is mounted, as well as with the component holder 21 which holds the radial lead type electronic component piece 50. Therefore, one unit of the pallet 4 can be used for both of the radial and coaxial lead type electronic components, and when the radial and coaxial lead type electronic component supply units 5A and 5B are arranged opposite to each of the pallets 4, respectively, the kind of electronic components which can be inserted can be substantially increased without increasing the apparatus installation area. 80 kinds of radial lead type electronic components only could be processed in the conventional case, but 80 kinds of radial lead type electronic components and 80 kinds of coaxial lead type electronic components can be selected in the case of this embodiment. In addition, the jumpers can be selected as one kind of coaxial lead type electronic components as well.

(4) The mount 31 of the pallet 4 is freely swung and the V-shaped grooves 34 which receive the leads 60A of the axial lead type electronic component are lifted up and down, so that the shift of the coaxial lead type electronic component 60 from the supply unit 6B to the grooves 34 can be achieved with reliability.

(5) The release mechanism 180 functions to slowly return the component holder 21, thereby preventing the pallet 4 from being broken and deteriorated because of rapid rotation of the holder 21.

A mechanism for supplying the radial lead type electronic components to the pallets will be described referring to the accompanying drawings.

As shown in FIGS. 15 through 19, the radial lead type electronic component supply mechanism includes a slider 201 arranged opposite to the pallet travelling path 3 and freely slidable forward and backward on a horizontal plane, and a pitch feeding unit 202 fixed on the slider 201. A plurality of these supply mechanisms are arranged opposite to the pallet travelling path or along the chain 3 with a certain interval interposed between them.

Figure 18:
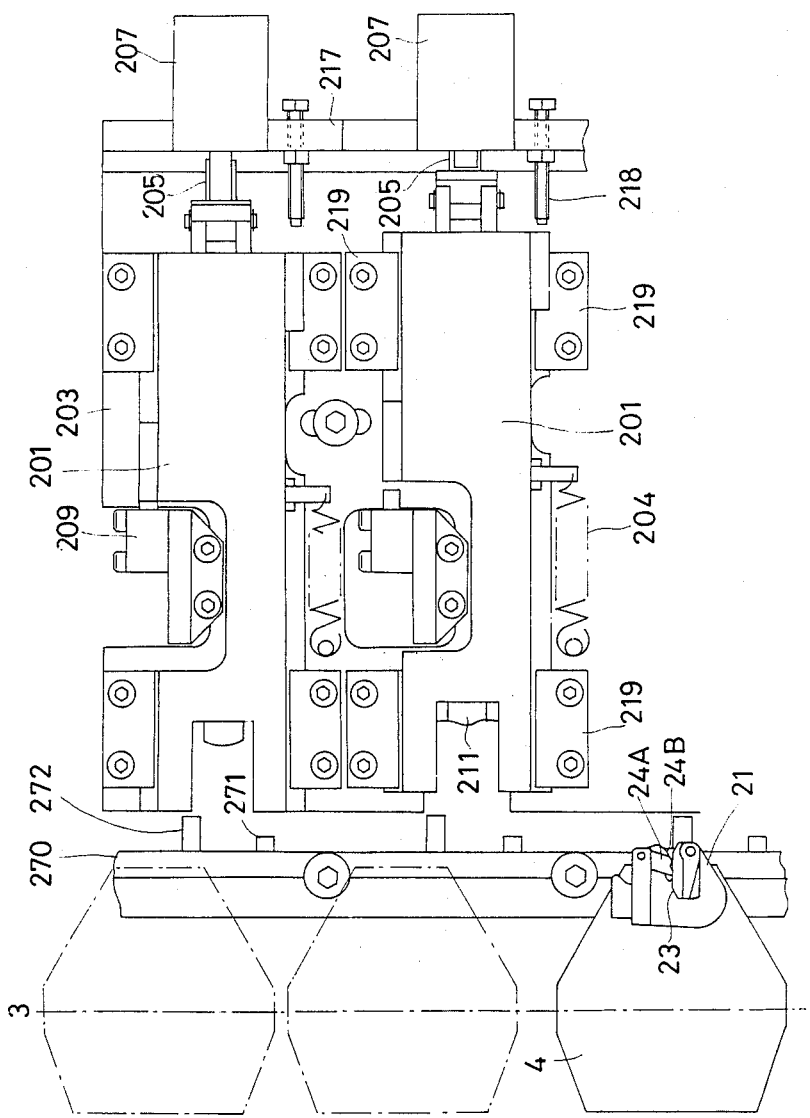
FIG. 18 is a plan view showing a mechanism for supporting and driving a slider.

As shown in FIGS. 18 and 19, the slider 201 of the supply mechanism is supported, freely slidable forward and backward in a direction vertical to the pallet travelling path, on the horizontal top surface of a body frame 203 by means of slide receiving members 219. The slider 201 is urged forward by an expandable spring 204.

Figure 15:
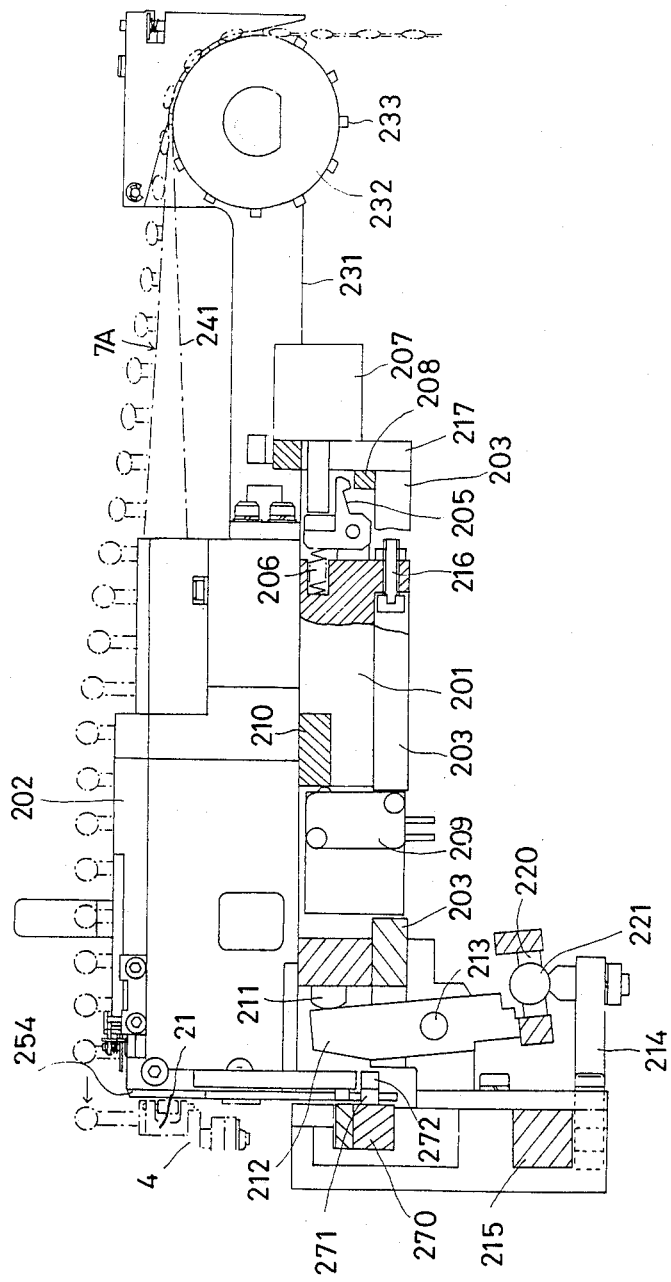
FIG. 15 is a side view showing a unit for supplying the radial lead type electronic components to the pallets.

A hook 205 is pivoted on the back end face of the slider 201 by a pin and normally urged in clockwise direction in FIG. 15 by a compression spring 206. Attached to a cylinder plate 217 which is vertically attached to the body frame 203 is an air cylinder for releasing the hook 205, which is engaged with an engaging member 208 fixed to the body frame 203 (the piston rod of the air cylinder 207 is retreated at this time), when the slider 201 is retreated as shown in FIG. 20 or when no radial lead type electronic component which is to be supplied by the supply mechanism is still selected. When the piston rod of the air cylinder 207 is extended, the hook 205 is pushed by the piston rod and thus swung in anti-clockwise direction to release from the engaging member 208, thereby allowing the slider 201 to be forwarded by the expandable spring 204. This represents a state under which the radial lead type electronic component to be supplied by the supply mechanism has been selected.

A mechanical valve 209 for detecting that the slider 201 has been at its forwarded position is fixed on the side of the body frame 203 while a member for rendering the mechanical valve 209 operative is fixed on the side of the slider 201.

Fixed to the front end face of the slider 201 is a contact member 211, which strikes against the upper end of a return lever 212 for returning the slider 201 to its retreated position. The return lever 212 is pivoted on the base frame by a rod 213, and a link ball 221 arranged at one end of a bell crank 214 is fitted into a groove 220 at the lower end of the return lever 212 with a predetermined clearance interposed between them. The other end of the bell crank 214 is operated associating with a bell crank operating bar 215, which is usually common to the bell cranks of the plural supply mechanisms. The reason why the link ball 221 is used is that the operating point of the return lever 212 travels on an arc different from the one on which the operating point of the bell crank 214 travels and that the mechanism therefore becomes complicated when the usual link arrangement is used. Both of the return lever 212 and the bell crank 214 can be simply associated with each other by the link ball 221 and they are left uninfluenced even when the position of the return lever 212 is changed in traverse direction.

A bolt 216 arranged at the back end of the slider 201 serves as a stopper member for exactly defining the forwarded position of the slider 201, and a stopper bolt 218 arranged at the cylinder plate 217 which is vertically attached to the body frame 203 is intended to define the retreated position of the slider 201.

Figure 17:
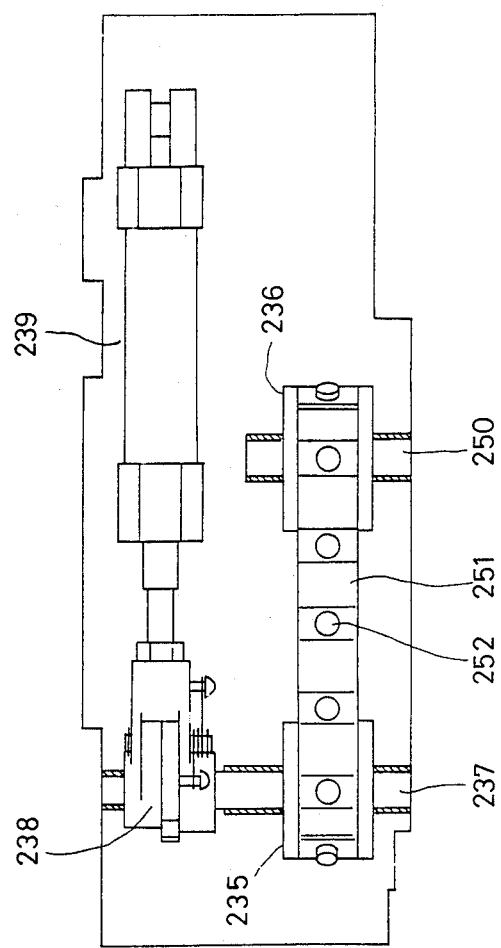
FIG. 17 is a side view showing the main portion of a pitch feed mechanism in the component supply unit in FIG. 16.

The pitch feeding unit 202 has a guide wheel 232 pivoted, freely rotatable on a vertical plane, onto the back end of a unit support frame 231. Arranged on the guide wheel 232 are feed pins 233 which correspond to feed apertures in a tape 241 of the radial lead type electronic component web carrier 7A. A feed guide groove 234 extends forward from the back end of the support frame 231. This feed guide groove 234 is intended to guide the radial lead type electronic component web carrier 7A, keeping the face of its tape 241 erected vertically. Drive and follower pulleys 235 and 236 are arranged along the feed guide groove 234. Both ends of a drive shaft 237 to which the drive pulley 235 is attached is freely rotatably supported on the side of the support frame 231, and the drive shaft 237 is driven by a pitch feeding air cylinder 239 through a ratchet mechanism 238, as shown in FIG. 17. A follower shaft 250 to which the follower pulley 236 is attached is freely rotatably supported on the side of the support frame 231. A timing belt 251 made of synthetic rubber or the like is stretched between the drive pulley 235 and the follower pulley 236. Arranged on the outer circumference of the timing belt 251 are feed protrusions 252 which correspond to the feed apertures 242 in the tape 241 of the radial lead type electronic component web carrier 7A.

The drive pulley 235 is intermittently rotated by 60° through the ratchet mechanism 238 every time when the air cylinder 239 finishes its one time reciprocation, thereby enabling the timing belt 251 to be forwarded by a distance (or one pitch) which corresponds to the interval between the two feed protrusions 252.

A lever 253 for detecting the lack of electronic component at the web carrier is arranged at the front of the feed guide groove 234 and a cutter 254 for cutting and separating that front end portion of the web carrier which is fed toward the pallet 4 through an opening at the front end of the feed guide groove 234 is arranged at the front end face of the support frame 231.

When the slider 201 is at its forwarded position, the lower end of the cutter 254 is held between short and long pins 271 and 272 arranged at a cutter operating bar 270 which is supported on the side of the body frame, thereby causing the cutter 254 operative to cut the electronic component web carrier 7A.

Figure 21:
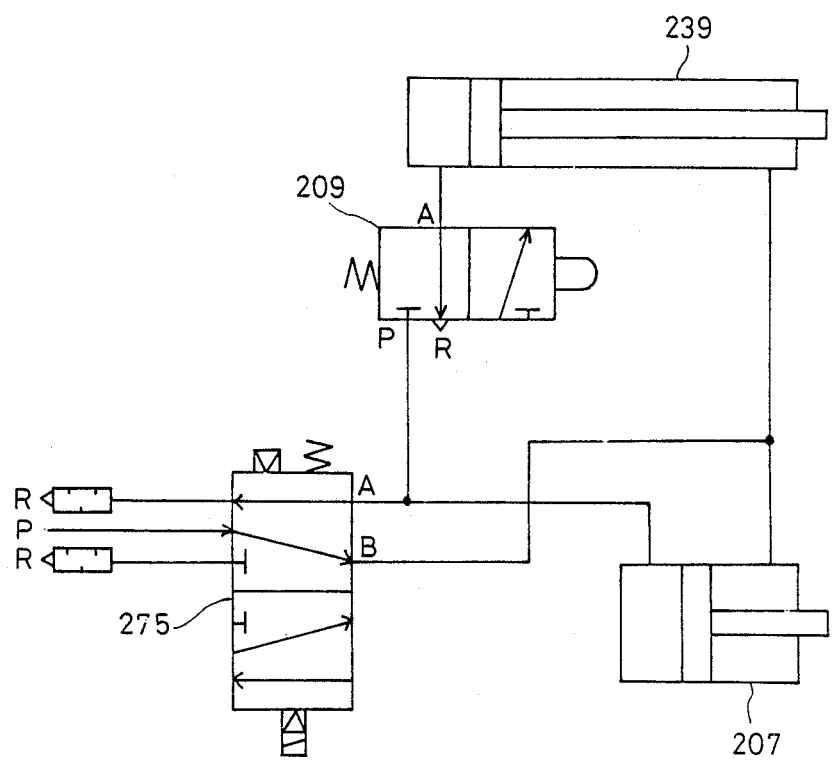
FIG. 21 shows a pressurized air circuit for the supply unit.

FIG. 21 shows an air pressure circuit for driving the pitch feeding air cylinder 239 and the slider forwarding air cylinder 207, wherein solenoid and mechanical valves 275 and 209 are provided to render the pitch feeding and slider forwarding air cylinders 239 and 207 operative through one air pressure source.

The operation of the above-described embodiment will be described, citing a case where the embodiment is applied to the electronic component supply and transfer apparatus shown in FIG. 3. The radial lead type electronic component supply mechanisms 5A shown in FIGS. 15 through 19 are arranged along the straight chain or pallet travelling path 3 in the electronic component supply and transfer apparatus shown in FIG. 3, corresponding to the pallets 4, respectively, and the radial lead type electronic component package 6A which rotatably houses a reel round which the radial lead type electronic component web carrier 7A is wound is connected to each of the radial lead type electronic component supply mechanisms 5A. The radial lead type electronic component web carrier 7A drawn from the package 6A is introduced to the quide wheel 232 of the pitch feeding unit 202, fed by the guide wheel 232, keeping the face of its tape 241 substantially horizontal, further twisted, changing the face of its tape 241 from horizontal state to vertical state, and then introduced into the feed guide groove 234. Namely, the tape 241 of the radial lead type electronic component web carrier 7A is engaged, under vertical state, with the timing belt 251 of the pitch feed unit 202 in the feed guide groove 234.

When the radial lead type electronic component of the radial lead type electronic component supply mechanism is selected by the numerical control, the solenoid valve 275 shown in FIG. 21 is rendered operative and pressurized air discharged through a port A of the solenoid valve 275 is divided to two flows, one of which is directed to the mechanical valve 209 and the other to the slider forwarding air cylinder 207. Since the mechanical valve 209 is kept inoperative when the slider 201 starts its forwarding, only the air cylinder 207 is operated, extending its piston rod to release the hook 205 from the engaging member 208, as shown in FIG. 15. As the result, the slider 201 is forwarded by the expandable spring 204 to become ready for selection (or the front end of the pitch feed unit 202 is held adjacent and opposite to the component holder 21 of the pallet (4). When the slider 201 finishes its forwarding, the mechanical valve 209 is rendered operative by the member 210 arranged on the side of the slider and pressurized air discharged through a port A of the mechanical valve 209 is introduced into the pitch feed air cylinder 239, thereby enabling the piston rod of the air cylinder 239 to be extended to carry out a predetermined pitch feed operation.

Following one time extension of the pitch feed air cylinder 239, the timing belt 251 is forwarded by a distance which corresponds to the pitch between the two feed protrusions 252. As the result, the radial lead type electronic component web carrier 7A whose apertures 242 are engaged with the feed protrusions 252 is projected exactly by one pitch from the front end of the feed guide groove 234 and introduced into the component holder 21 of the pallet 4, as shown in FIG. 5. The component holder 21 of the pallet 4 holds that portion of the electronic component web carrier 7A, which has been introduced into the holder 21, by means of its guide 23 and claws 24A, 24B.

After the slider 201 finishes its forwading and pitch feeding operation, the solenoid valve 275 is rendered inoperative and each of the cylinders 207 and 239 retreats its piston rod.

As the result of having forwarded the slider 201, the cutter 254 of the pitch feed unit 202 whose lower end is held between the two short and long pins 271 and 272 cuts the tape 241 of the radial lead type electronic component web carrier 7A due to the sliding movement of the short and long pins 271 and 272 substantially at the same time when each of the cylinders 207 and 239 returns to its original state. As the result, that front end portion of the electronic component web carrier 7A which is held on the pallet 4 is cut off and held by the component holder 21 on the pallet 4 as a radial lead type electronic component piece 50.

When the cutter 254 returns to its original state, the bell crank 214 moves, associating with the bell crank operating bar 215, so that the return lever 212 is swung in clockwise direction in FIG. 15 to return the slider 201 to its retreated position. When the slider 201 is returned to its retreated position, the hook 205 is engaged with the engaging member 208, as shown in FIG. 20, keeping the slider 201 retreated. The slider 201 is kept like this until the radial lead type electronic component web carrier in the supply mechanism is selected by the numerical control (NC).

The radial lead type electronic component piece 50 which has been cut off by the cutter 254 is transferred, keeping its tape face vertical in relation to the pallet travelling direction X, as shown in FIG. 5, to the component shift position Z where it is shifted to the chuck 10 of the circulating chuck mechanism 11, as shown in FIG. 3.

According to the above-described embodiment, the slider forwarding air cylinder 207 and the pitch feeding air cylinder 239 are operated in an order which is controlled by the mechanical valve 209, associating with the operation of the slider 201. Therefore, the radial lead type electronic component web carrier 7A can be pitch-fed exactly when the slider 201 and the pitch feed unit 202 are at their forwarded positions, and reliable supply of the radial lead type electronic component web carrier to the side of the pallets can be guaranteed. In addition, only one pressurized air source can be enough to supply pressurized air to the air cylinders and the number of valves needed can be kept minimum, thereby making the cost more economical. Further, the reciprocation of the slider 1 is linear and it is supposed that the slider 1 is less changed in attitude at the time of pitch-feeding the radial lead type electronic component web carrier, as compared with the case where the slider moves like an arc. Therefore, the slider can be moved more smoothly. Furthermore, the pitch feed unit 202 employs the timing belt 251 to feed the web carrier in a straight line, thereby preventing the electronic component web carrier from being deformed. This means that the electronic component piece 50 transferred on the pallet 4 is deformed neither. This means finally that the ratio of the radial lead type electronic components inserted into the printed circuit board can be enhanced.

Figure 22:
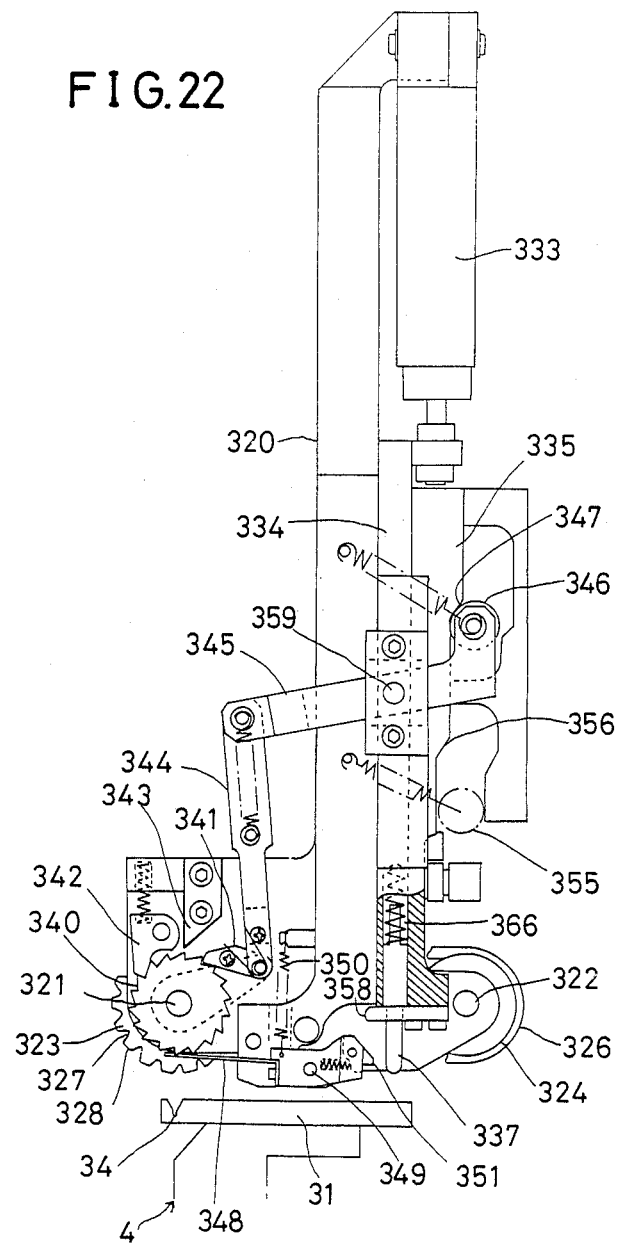
FIG. 22 is a sectional front view showing a unit for supplying the coaxial lead type electronic components.
Figure 23:
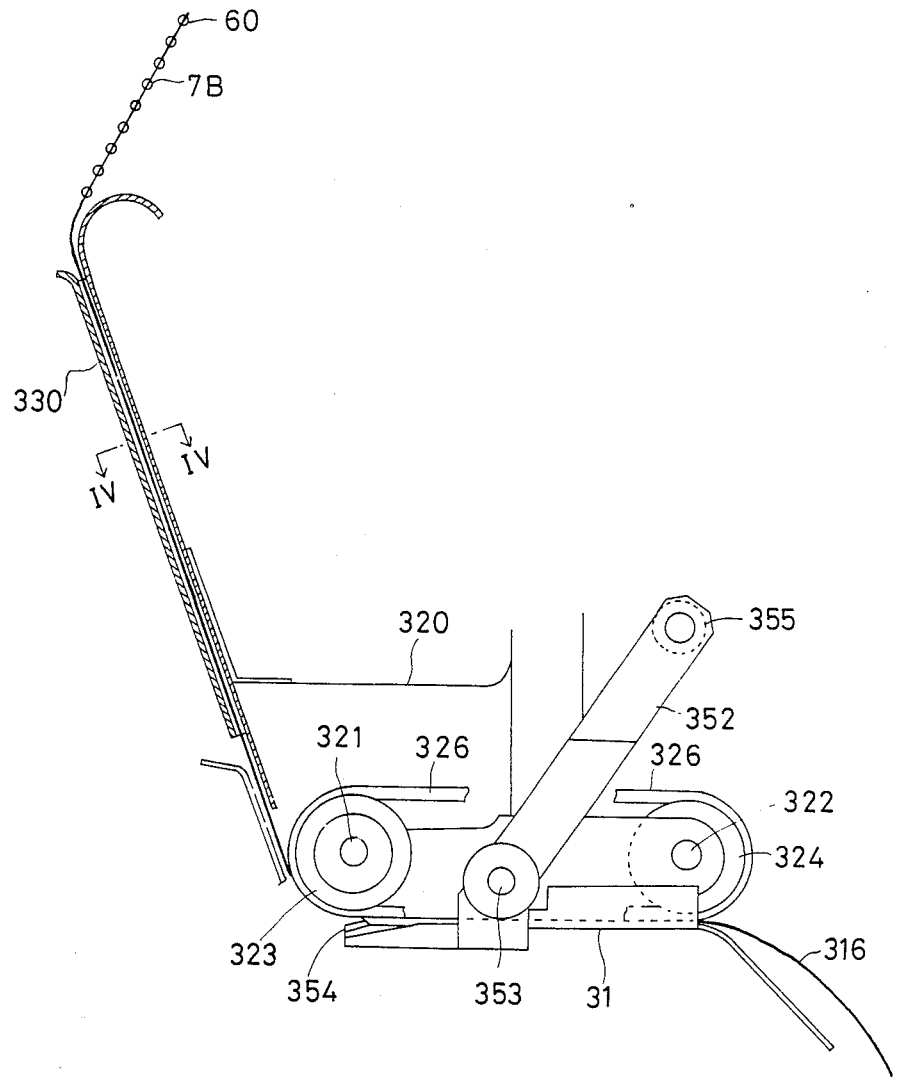
FIG. 23 is a sectional front view showing a guide, a cutter mechanism and the like arranged on the component entrance side.
Figure 24:
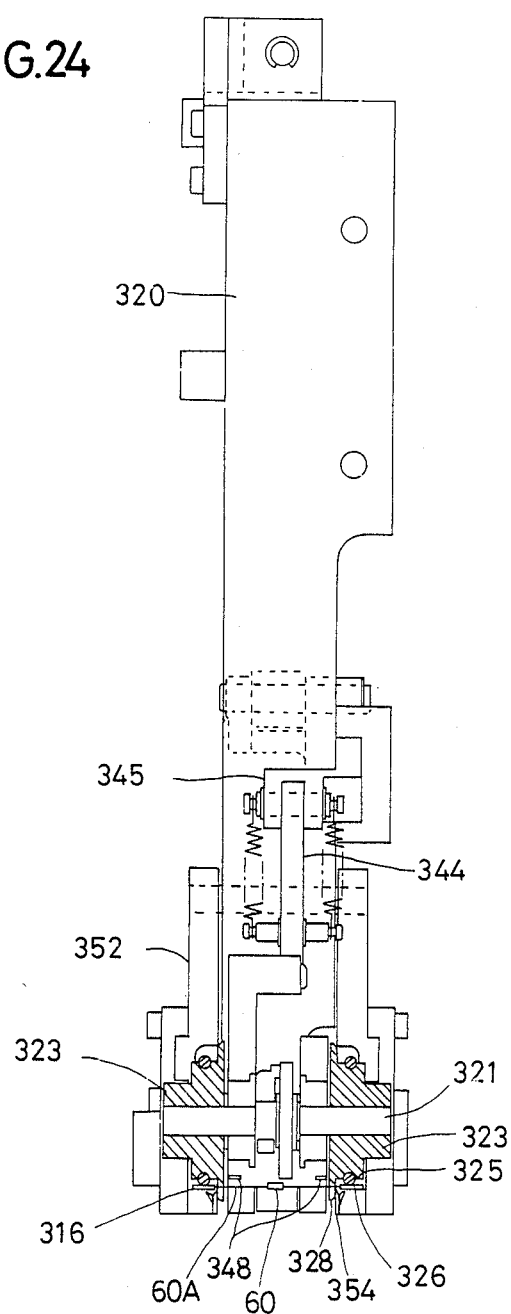
FIG. 24 is a side view showing a part of the unit in FIG. 22 sectioned.

A coaxial lead type electronic component supply mechanism serves to cut off the coaxial lead type electronic component one by one from the axial lead type electronic component web carrier and supply it to the pallet, and its arrangement is shown in detail in FIGS. 22 through 30. An intermittently-driven shaft 321 and a follower shaft 322 are pivoted on the lower end portion of a a body frame 320, and a pair of drive wheels 323 are fixed to the driven shaft 321 while a pair of follower wheels 324 to the follower shaft 322. A feed belt 326 is stretched between belt winding portions 325 of the drive wheels and the follower wheels 324. Each of the drive wheels 323 has a position determining section 328 on which V-shaped lead positioning recesses 327 which correspond to the interval between the two adjacent electronic components on the axial lead type electronic component web carrier 7B are formed. As the result, that tape portion 316 of the coaxial lead type electronic component web carrier 7B which is guided by a guide 330 arranged on the side of web carrier entrance is contacted with and driven by the feed belt 326, with the leads 60A defined by the lead positioning recesses 327 on the position determining section 328, as shown in FIG. 23.

Figure 25:
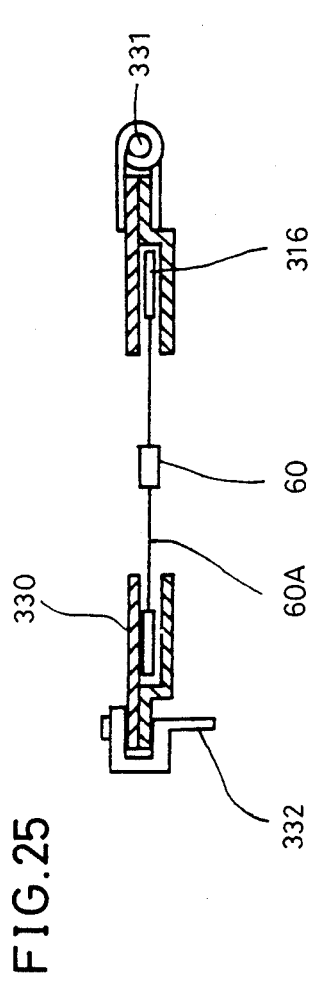
FIG. 25 is a sectional view taken along a line IV—IV in FIG. 23.

As shown in FIG. 25, the guide 330 arranged on the side of web carrier entrance comprises two plates whose one ends are connected by a hinge 331 in such a way that they can be swung open, and when a lock 332 is released, the axial lead type electronic component 7B can be easily detached.

A drive air cylinder 333 is attached to the upper portion of the body frame 320 and a slider 334 which slides up and down along the body frame 320 is connected to the piston rod of the air cylinder 333. A plate cam 335 is fixed onto the slider 334. An air cushioning cylinder 336 (combined with a spring) is incorporated in the lower end of the slider 334 and the piston rod of this air cushioning cylinder 336 serves as a pallet lifting rod 337.

A feed ratchet wheel 340 is fixed to the center of the intermittently-driven shaft 321 and a feed pawl 341 and a detent pawl 342 are engaged with the feed ratchet wheel 340. A feed pawl stopper 343 for defining the movement of the feed pawl 341 is further fixed to the body frame. Both of the feed pawl 341 and the detent pawl 342 are urged toward the feed ratchet wheel 340 by springs. Links 344 and 345 are connected to the feed pawl 341 and the link 345 is pivoted on the body frame. A ratchet feeding roller 346 arranged at one end of the link 345 can be contacted with a ratchet driving cam face 347 of the plate cam 335 which is associated with the drive air cylinder 333.

Figure 26:
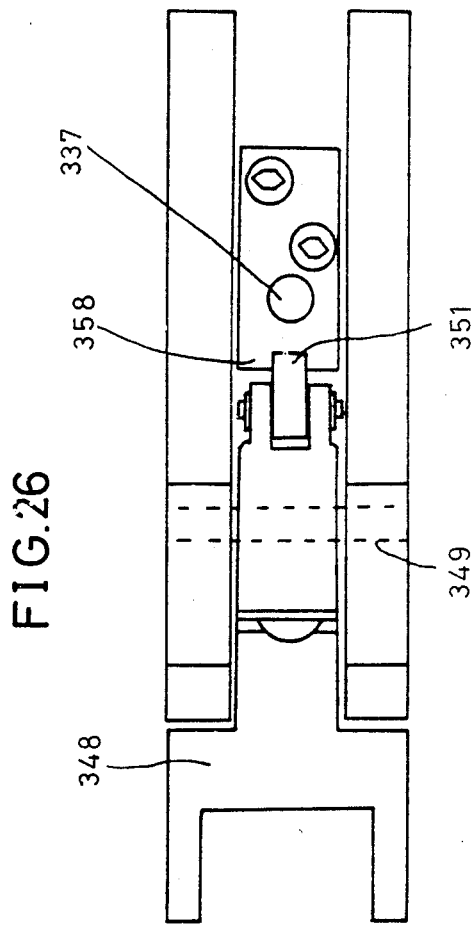
FIG. 26 is a view showing a lead holding leaf spring viewed from the bottom side thereof.

A lead holding plate spring 348 is pivoted by a pin 349 on the body frame 320 adjacent to the lower end face thereof, as shown in FIG. 26. The lead holding plate spring 348 is usually urged upward by an expandable spring 350. Arranged at the back end of the lead holding plate spring 348 is a hooking pawl 351, which is usually urged in its projecting direction by a compression spring.

As shown in FIG. 23, a cutter driving lever 352 is pivoted on the lower portion of the body frame by a rod 353 and a movable cutter blade 354 is attached to the front end of the cutter driving lever 352. A cutter driving roller 355 is arranged at the upper end of the cutter driving lever 352. The movable cutter blade 354 can move, contacting the outer face of the position determining section 328 on the drive wheel 323, and the outer face of the position determining section 328 serves as a fixed blade. The cutter driving roller 355 can be contacted with a cutter driving cam face 356 of the plate cam 335 which is associated with the air cylinder 333.

When the coaxial lead type electronic component 60 is cut off, the tape 316 of the coaxial lead type electronic component web carrier is discharged in such a way that it is sandwiched between a seat guide 360 arranged under the drive and follower wheels 323, 324 and the feed belt 326, as shown in FIG. 23.

When the supply mechanism is ready for operation, the piston rod of the drive air cylinder 333 is at its lifted or retracted position, as shown in FIG. 22, and both of the feed pawl 341 and the detent pawl 342 are as shown in FIG. 22. Therefore, the drive wheel 322 is stopped only by the detent pawl 342, but it can be manually rotated in the feeding or anti-clockwise direction. Under this state, therefore, a first coaxial lead type electronic component web carrier 7B can be easily mounted on the mechanism.

Figure 27:
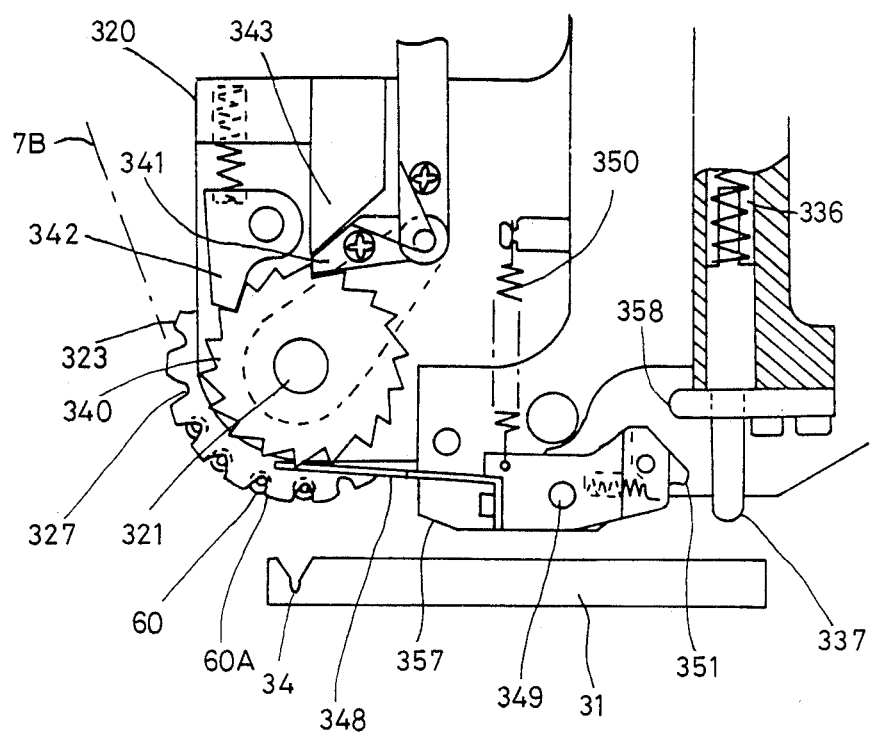
FIG. 27 is a sectional front view showing a ratchet wheel rotated by a certain amount by a feed pawl.

When pressurized air is supplied to the air cylinder 333 and the piston rod of the air cylinder 333 starts its lowering, following the order of the NC, the ratchet feeding roller 346 is contacted with the ratchet driving cam face 347 of the plate cam 335, so that the links 345 and 344 are moved to drive the feed pawl 341 until the latter strikes the feed pawl stopper 343, as shown in FIG. 27. The drive wheels are rotated to a predetermined extent because of this ratchet operation, and the axial lead type electronic component 60 reaches a predetermined position (where it is cut off by the cutter means).

Figure 28:
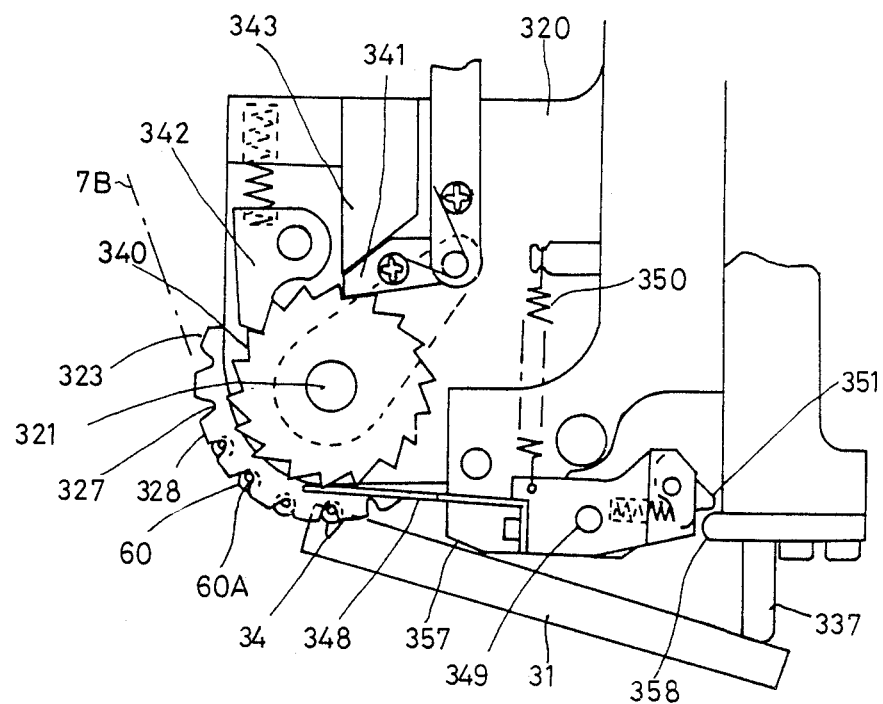
FIG. 28 is a sectional front view showing the front ends of a unit, on which the coaxial electronic component is mounted, lifted by a lowering rod.

Further, thanks to the extending piston rod of the air cylinder 333, the pallet lifting rod 337 strikes the seat metal 82 on the mount 31 arranged on the side of the pallet 4, to thereby lift the front end of the mount 31, as shown in FIG. 28.

Figure 29:
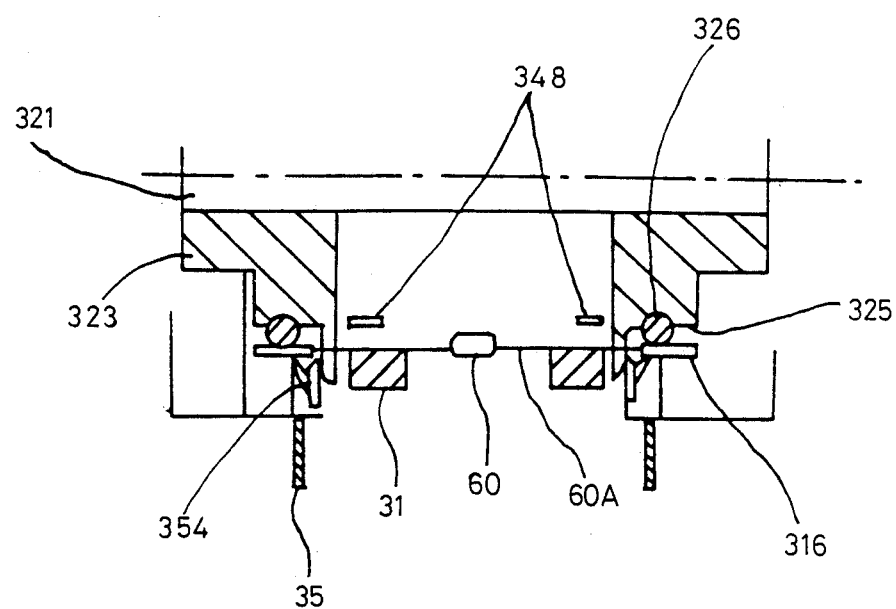
FIG. 29 is a sectional side view showing the unit in FIG. 28.

As the result, the V-shaped grooves 34 on the mount 31 are engaged with the leads 60A of the coaxial lead type electronic component 60 which has been positioned by the lead positioning recesses 327 on the drive wheels 323, as shown in FIGS. 28 and 29. The lifting movement of the mount 31 is stopped by the pallet stopper 357 this time and the lowering of the slider 334 thereafter caused by the still extending piston rod of the air cylinder 333 is absorbed by the air cushioning cylinder 336.

The cutter driving roller 355 is contacted with the cutter driving cam face 356 of the plate cam 335 by the subsequent lowering movement of the slider 334, thereby causing the cutter driving lever 352 to be swung in clockwise direction to let the leads 60A of the axial lead type electronic component web carrier be cut between those outer faces of the position determining sections on the drive wheels which serve as the fixed cutter blades and the movable cutter blades 354, so that the coaxial lead type electronic component 60 thus cut off can be delivered to the V-shaped recesses 34 of the mount 31 on the pallet.

The front end portions 35A of the stopper 35 arranged on the side of the pallet are positioned, as shown in FIG. 4, under the movable cutter blades 354 at the time when the cutter operation is being carried out, but they are only urged upward by the spring 36. Therefore, they cannot disturb the movement of the movable cutters 354 and after the cutter operation is finished, they are positioned beside the mount 31, as the front end portions of the mount 31 is lowered, to position-define the front ends of the leads of the coaxial lead type electronic component 60.

Figure 30:
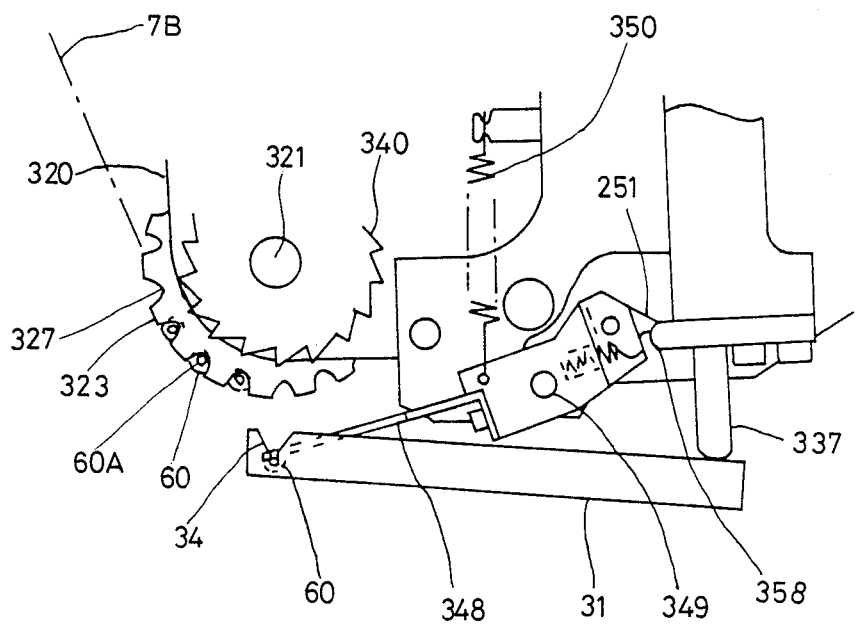
FIG. 30 is a sectional front view showing the unit returned to its original state.

After the air cylinder 333 finishes its piston rod extension movement, pressurized air supply to the cylinder is stopped by the timer set by the NC, and the cylinder 333 starts its piston rod retreating movement. The piston rod is thus lifted, returning the movable cutter blades 354 to their original state at first and then causing the hook pawl 351 at the back end of the lead holding plate spring 348 to be engaged with the hook member 358 at the lower end of the slider 334, so that the front ends of the lead holding plate spring 348 start their lowering to press or hold the leads 60A in the recesses 34 of the mount 31. The air cushioning cylinder 336 returns from its compressed state to its original state for this while, and when it is extended, the pallet lifting rod 337 rises and the mount 31 starts returning to its original state. Flexibly holding or pressing the leads 60A of the coaxial lead type electronic component 60, the lead holding plate spring 348 is synchronized with the mount 31 this time to lower its front ends, as shown in FIG. 30, and when its front ends are lowered to their utmost extent, the hooked pawl 351 is released from the hook member 358 to thereby make it ready for a next operation. The feed pawl 341 which is engaged with the feed ratchet wheel 340 is also made ready for a next operation for this while.

As the result of the above-described operations, the leads 60A which have been received in the V-shaped recesses 34 of the mount 31 are position-defined by the plate spring stopper 35 and the coaxial lead type electronic component 60 is supplied, under this state, to the pallet 4.

Effects achieved by the above-described embodiment are as follows:

(1) Since the air cylinder 333 is enough to reciprocate its piston rod, the mechanism can be made simple and none of the complicated rotary solenoid and the like is needed, thereby making the cost lower and the current consumption less.

(2) Since the cutter means is rendered operative through lever arrangement, the space which the front end portion of the cutter means occupies can be made minimum and the operation of delivering the electronic component to the pallet can be carried out at a shorter stroke. None of additional guide, shoot and the like is needed and direct cutting is carried out without doing any shift of the component, thereby enabling cutting reliability to be enhanced. Since the leads are cut off from the axial lead type electronic component web carrier, reliability in cutting operation is higher as compared with the operation of cutting the tape.

(3) It is not needed that cutting operation is carried out, keeping the drive wheel 323 rotated. Therefore, positional relation between the electronic component and the pallet 4 can be made clearer and positioning of these component and pallet can be made easier. In addition, longer time margin can be allowed and reliability in component delivery can be enhanced.

(4) The V-shaped grooves 34 of the mount 31 on the pallet overlap the lead positioning recess 327 of the drive wheel 323 prior to the cutter operation. Therefore, the distance along which the coaxial lead type electronic component is dropped by the cutter operation is negligible. Synchronous with the lowering front ends of the mount 31, the lead holding plate spring 348 is lowered, holding or pressing the leads 60A. Therefore, the leads of the coaxial lead type electronic component 60 is always kept held in the course of cutting off the coaxial lead type electronic component 60 from its web carrier 7B and supplying it to the mount 31 on the pallet 4, thereby enabling the component delivery to the pallet 4 to be achieved with higher reliability and at a higher speed. Further, the plate spring stopper 35 arranged on the side of the pallet can horizontally define the position of the leads of the coaxial lead type electronic component 60 without disturbing the operation of the cutters.

Figure 31:
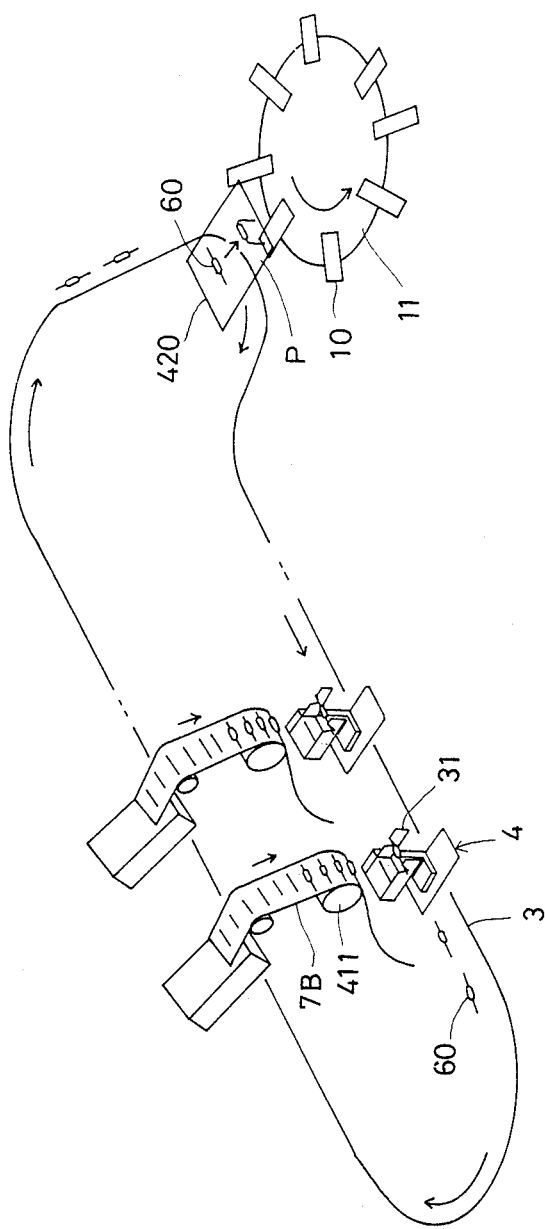
FIG. 31 is a perspective view showing the position of a lead re-forming unit in the machine of the present invention.

As shown in FIG. 31, coaxial lead type electronic component supply units 411 are arranged along the straight pallet travelling path and each of them cuts off the coaxial lead type electronic component 60 one by one from the coaxial lead type electronic component web carrier 7B and supplies it to the mount 31 on the pallet 4. The electronic component 60 is transferred, parallel to the pallet travelling path, toward the component shift position P where it is opposed to the chuck 10 of the circulating chuck mechanism 11, following the intermittent travel of the pellet 4. Since the chuck 10 which is held ready at the component shift position P can grip not the leads of the coaxial lead type electronic component but the ones of the radial lead type electronic component, the leads of the coaxial lead type electronic component 60 must be re-formed to the ones of the radial lead type electronic component until they reach the component shift position P. For this purpose, lead re-forming means 420 which will be shown in detail in FIGS. 32 through 47 is arranged on an arc pallet travelling path in which the component shift position P is included.

Figure 32:
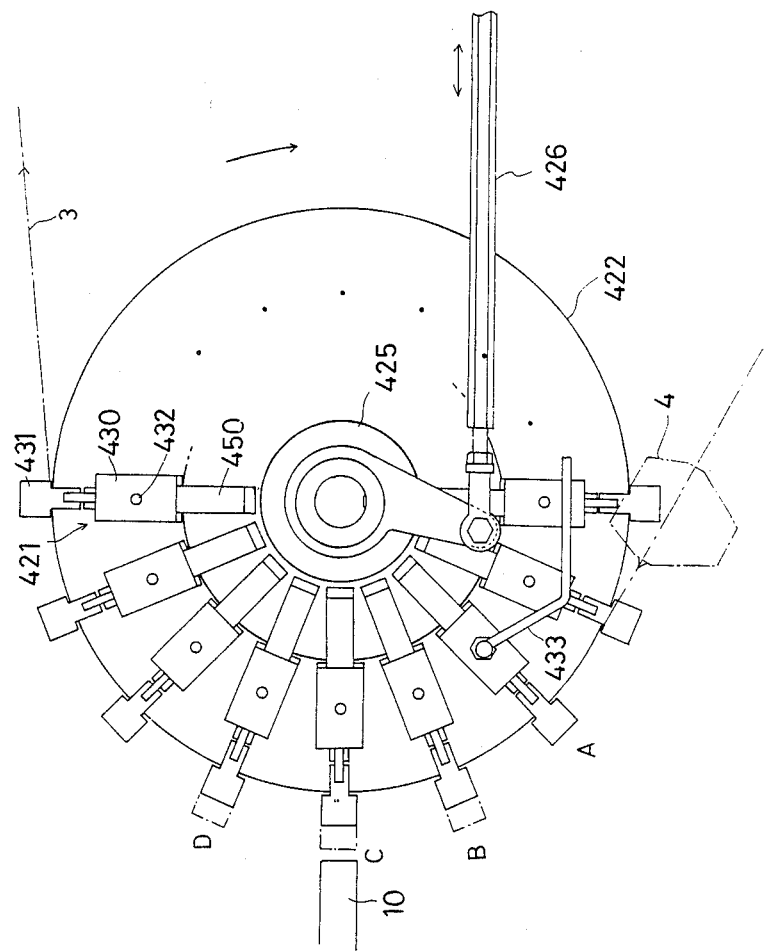
FIG. 32 is a plan view showing the whole arrangement of the unit for re-forming the leads of the coaxial lead type electronic component.
Figure 33:
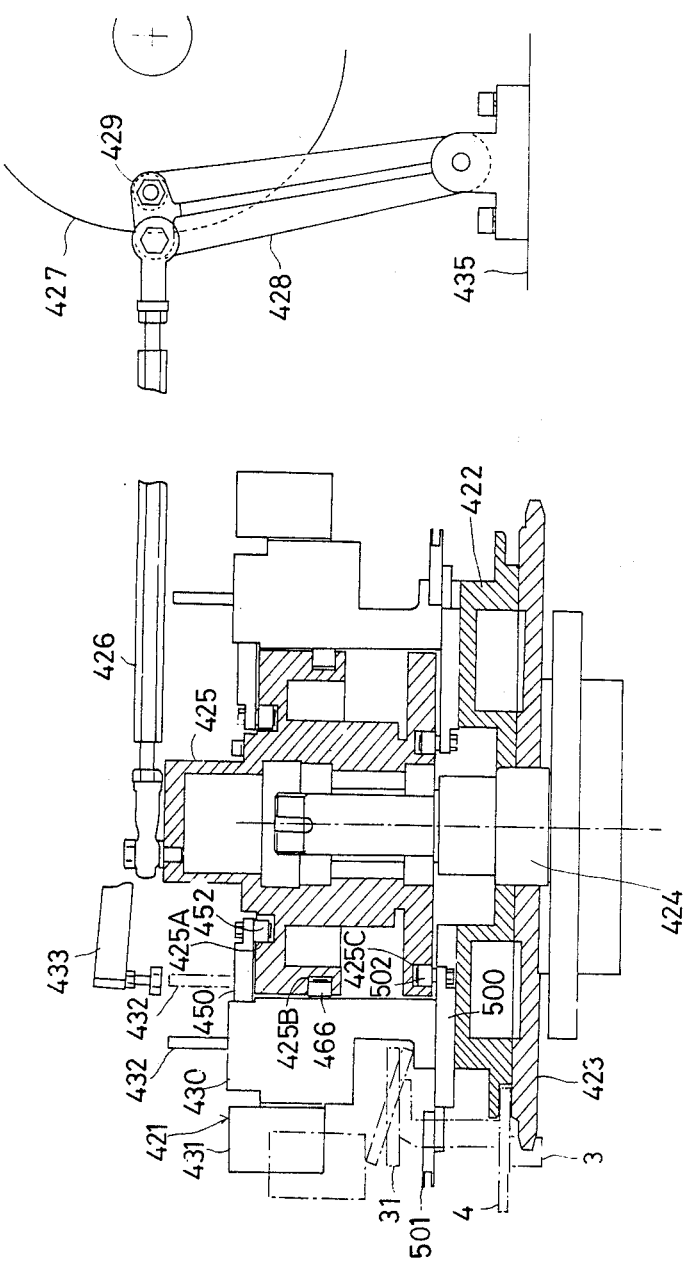
FIG. 33 is a sectional front view showing the re-forming unit.
Figure 34:
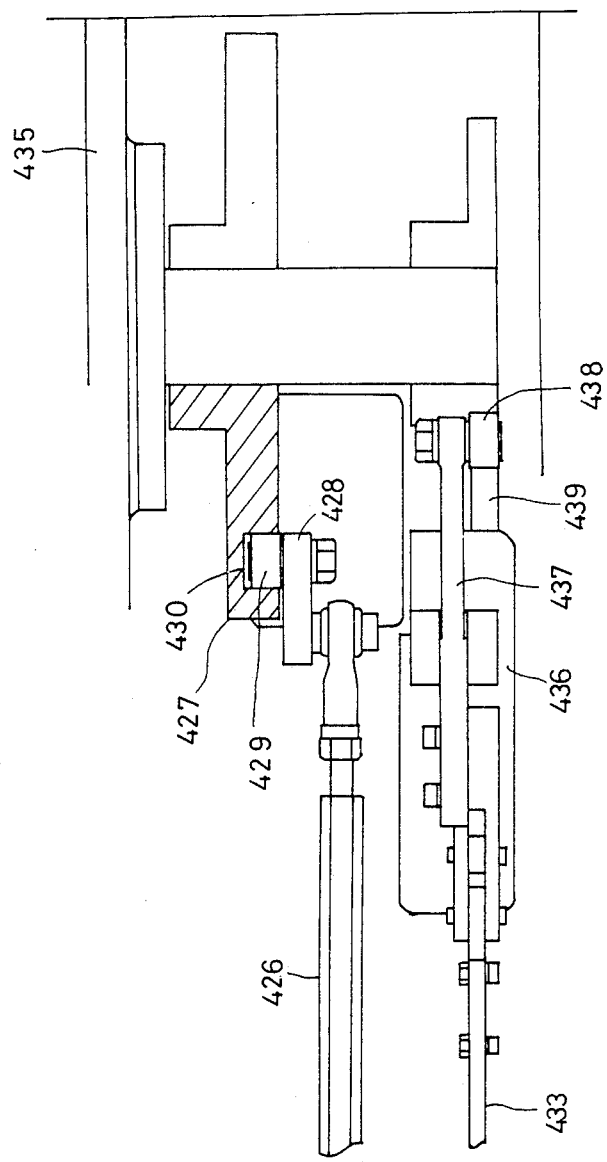
FIG. 34 is a plan view showing a mechanism for driving a cylindrical cam.

FIGS. 32 and 33 show the whole of the lead re-forming means 420 for the coaxial lead type electronic components. Re-forming units 421 (sixteen units, for example) are arranged on an index table 422 with an equal angle interposed between them and the index table 422 is fixed to an intermittently-rotating shaft 424 for a sprocket 423 which is engaged with the chain 3 for travelling the pallet 4 on an arc. The interval between the two adjacent re-forming units 421 corresponds to the one between the two adjacent pallets 4 and the re-forming units 421 are intermittently circulated, synchronous with the pallets 4. A cylindrical cam 425 is pivotally supported on the shaft 424. The cylindrical cam 425 has plural cam grooves 425A, 425B and 425C for enabling each of the re-forming units 421 to carry out its lead re-forming operation. As shown in FIG. 34, the cylindrical cam 425 is connected to a cam follower 428 through a connector rod 426, said follower cam 428 being operated by another main drive cam 427. More specifically, a roller 429 of the cam follower 428 is fitted into a cam groove 430 in a cam 427. Following the rotation of the cam 427, the cylindrical cam 425 is rotated together with the index table 422 in a direction and it is inversely rotated at the time when the index table 422 is stopped, thereby letting the cam faces 425A, 425B and 425C cause each of the re-forming units 421 to carry out a predetermined operation, corresponding to its position.

Figure 35:
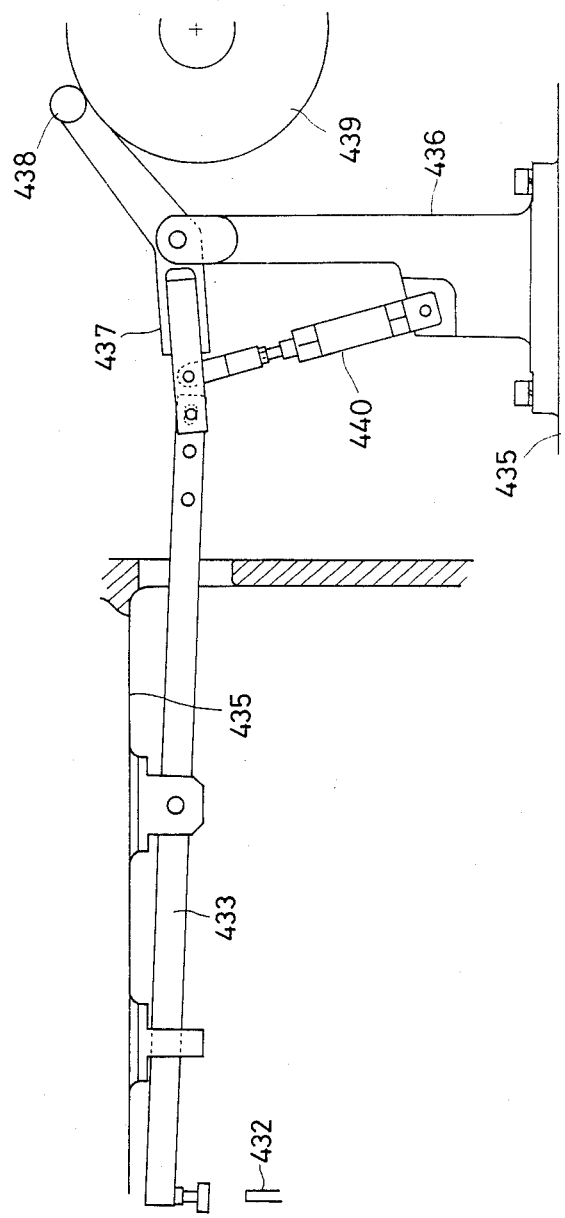
FIG. 35 is a front view showing a mechanism for driving a rod which renders a push rod of a press unit.

The re-forming unit 421 moves, following the intermittent rotation of the index table 422 (or synchronous with the pallet 4), and it has a body 430 fixed thereon and a head 431 connected to the body 430 through a parallel link. A rod 432 for operating the push rod which lifts the front ends of the mount 31 on the pallet 4 is arranged, freely slidable up and down, in the body 430. A lever 433 shown in FIGS. 34 and 35 is pivotally supported by a body frame 435 to push down the rod 432 of the re-forming unit 421 positioned at a point A in FIG. 32. The lever 433 is connected to cam follower 437 pivoted on a bracket 436 which is errected on the body frame 435. A roller 438 of the cam follower 437 is contacted with a push rod driving cam 439.

An coaxial/radial changeover air cylinder 440 is connected between the cam follower 437 and the bracket 436, and when the air cylinder 440 is extended, the cam follower 437 is contacted with the push rod driving cam 439 to render the lever 433 operative. This is because, in a case where the pallet 4 is used to transfer both of the coaxial and radial lead type electronic components, the lever 433 is operated to push down the rod 432 only when the pallet 4 which now transfers the coaxial lead type electronic component reaches the point A in FIG. 32.

Figure 36:
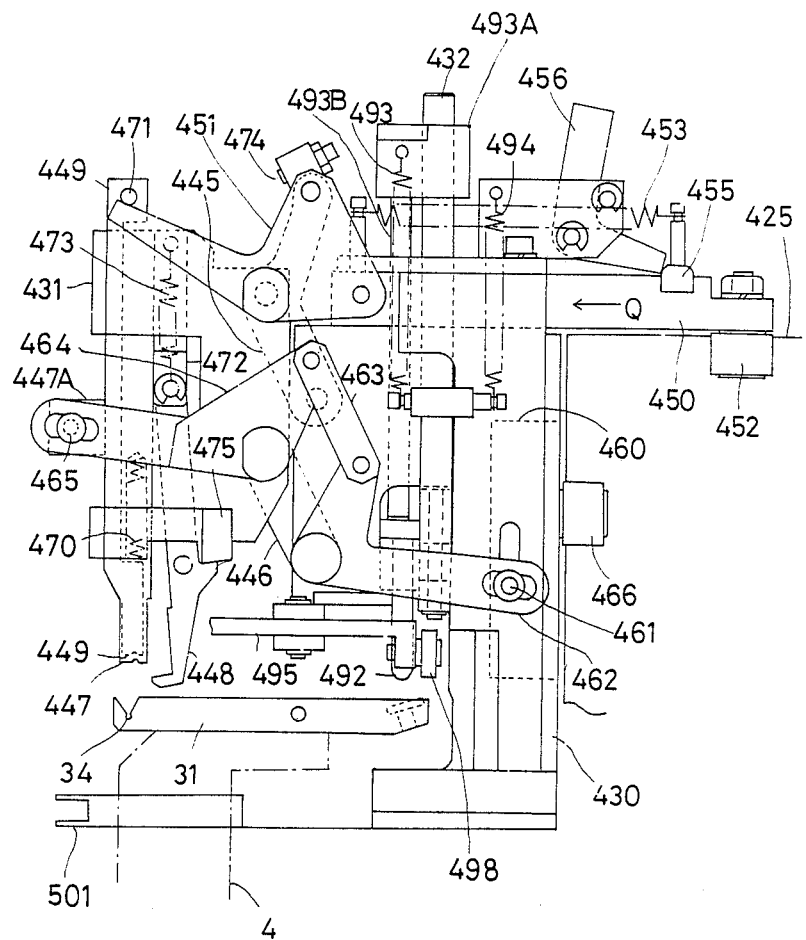
FIG. 36 is a front view showing one link mechanism of the press unit.
Figure 37:
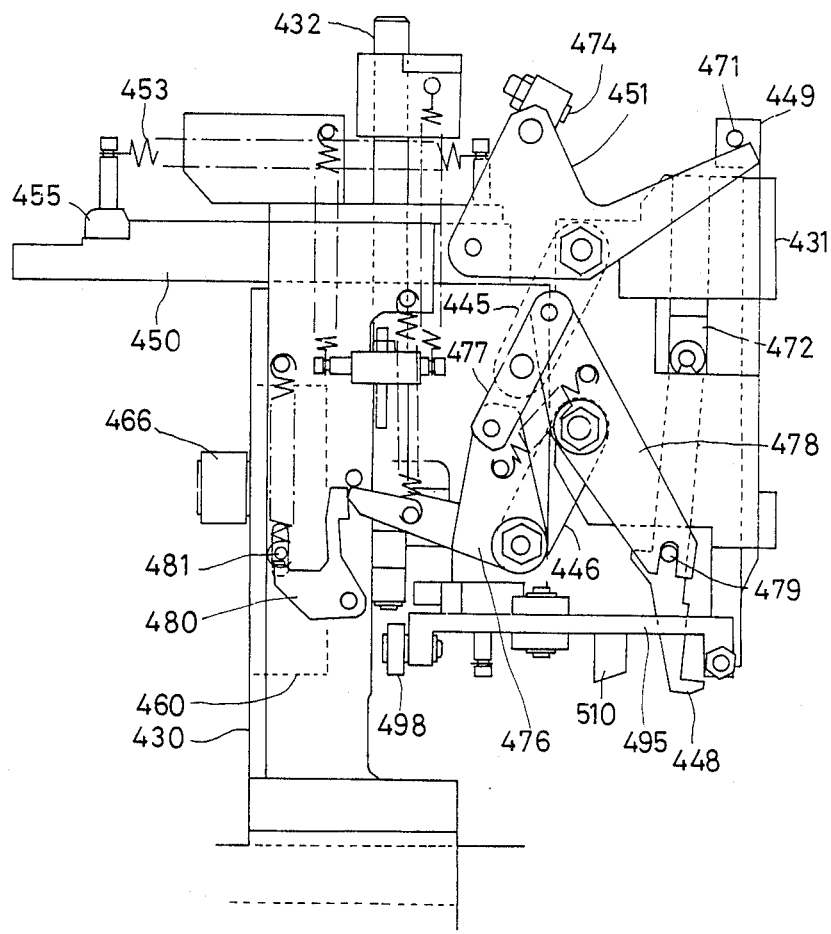
FIG. 37 is a backside view showing the other link mechanism of the press unit.
Figure 38:
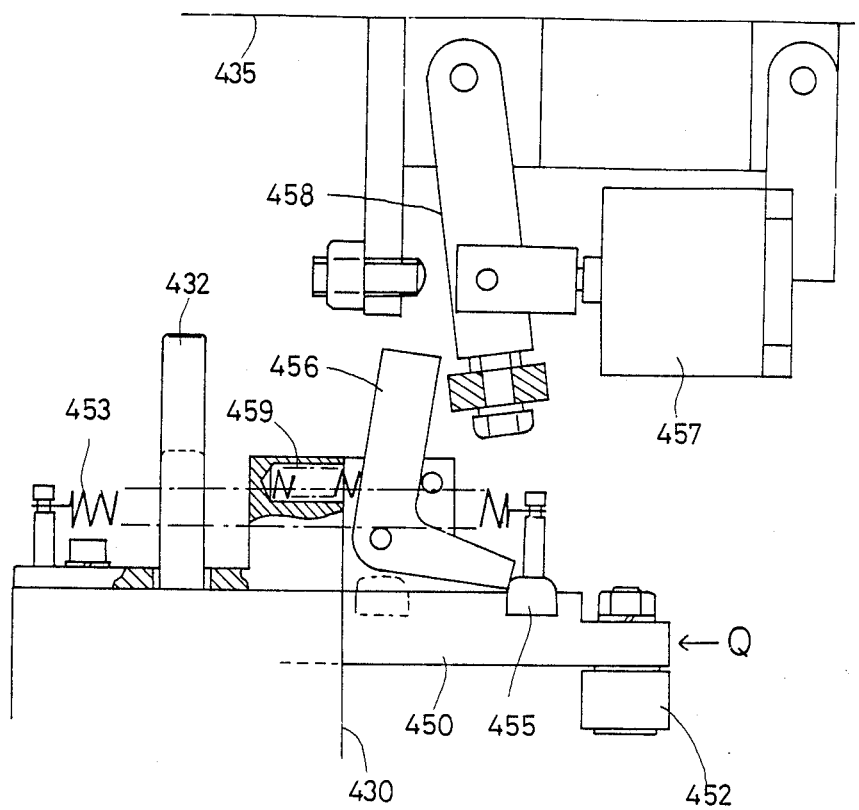
FIG. 38 is a front view showing a mechanism for changing over the operation of the press unit to correspond to the coaxial and radial lead type electronic components.

FIGS. 36 through 38 show the re-forming unit 421 in detail, wherein FIG. 37 is a view viewed from a side opposite to the re-forming unit 421 shown in FIG. 36. The head 431 is connected to the body 430 through parallel links 445 and 446, and it is provided with outer, inner and push presses 447, 448 and 449. The lower end profile of each of these outer, inner and push presses 447, 448 and 449 is shown in FIGS. 43 through 46. A slider 450 for lifting the head up and down is arranged, freely slidable in horizontal direction, at the upper portion of the body 430, and it is urged forward (or in a direction Q) by an expandable spring 453. The front end of the slider 450 is connected to the head 431 through a link 451. A roller 452 at the back end of the slider 450 can be engaged with the cam groove 425A in the cylindrical cam 425. In FIGS. 36 and 37, the slider 450 is retreated while the head is at its lifted position.

A stopper 455 is fixed onto the upper face of the slider 450 and a stopper lever 456 is provided, engageable with the stopper 455, on the body 430. An coaxial/-radial changeover air cylinder 457 is attached to the body frame 435, as shown in FIG. 38, and a lever 458 which is driven by the air cylinder 457 rotates the stopper lever 456 in anticlockwise direction, following the extension of the air cylinder 457, when the pallet 4 which holds the coaxial lead type electronic component reaches a point B in FIG. 32, thereby releasing the stopper lever 456 from the stopper 455 and thereafter causing the roller 452 at the back end of the slider 450 to move along the cam groove 425A in the cylindrical cam 425. A compression spring 459 is interposed between the stopper lever 456 and the body 430 to urge the stopper lever 456 in clockwise direction.

A re-forming press driving slider 460 is arranged, freely slidable in the vertical direction, at the body 430. Connected to a pin 461 at the slider 460 is one end of a bell crank 462 which is pivoted on the body 430, while the other end thereof is connected to one end of a lever 464 through a link 463, said lever 464 being pivoted on the head 431. The other end of the lever 464 is connected to a connector portion 447A of the outer press 447 through a pin 465. The slider 460 is provided with a roller 466, which is engaged with the cam groove 425B in the cylindrical cam 425.

Figure 39:
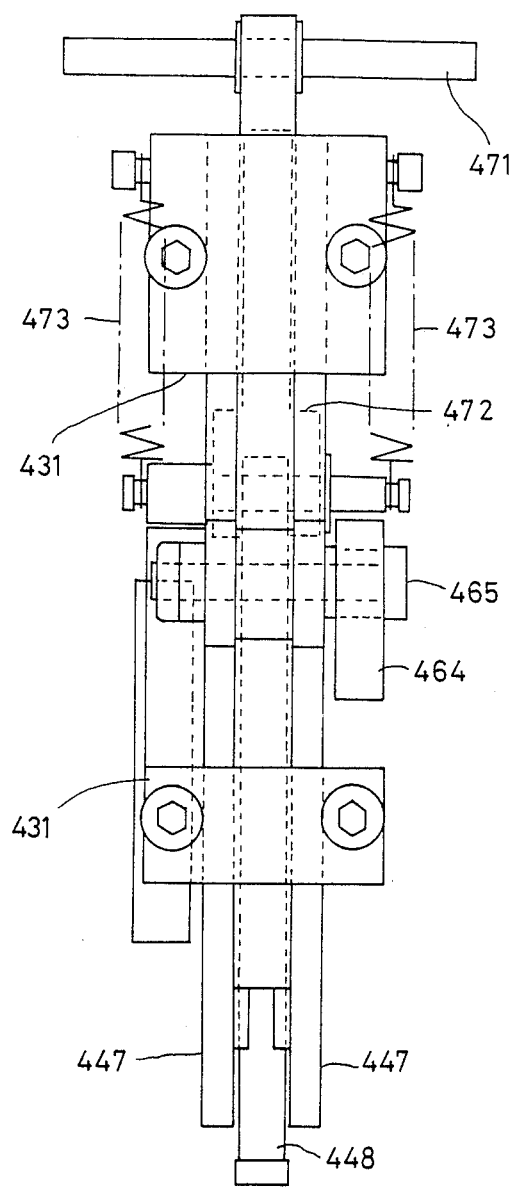
FIG. 39 is a side view showing the arrangement of outer and inner presses.

As shown in FIGS. 36, 37 and 39, the outer and push presses 447 and 449 are attached, freely slidable up and down, to the head 431, wherein the push press 449 is arranged between the outer press 447 and urged downward by a compression spring 470. A pin 471 is fixed to the upper end of the push press 449 and engaged with the link 451.

A slider 472 is attached, freely slidable up and down, to the head 431 and the upper end of the inner press 448 is pivoted on the lower end of this slider 472. The slider 472 is urged upward by an expandable spring 473. The slider 472 is pushed down by an actuator 474 of the link 451 when the link 451 is swung in anti-clockwise direction. When it is under retreated state, the inner press 448 is engaged with an engaging member 475 arranged on the side of the head 431, and it is thus forcedly lowered, as shown in FIG. 36. A mechanism which drives the inner press 448 is mainly shown in FIG. 37. One end of a bell crank 476 which is fixed coaxial and associated with the bell crank 462 is connected to one end of a lever 478, which is pivoted on the head 431, through a link 477 and the other end of the lever 478 is engaged with a pin 479 on the inner press 448. The other end of the bell crank 476 can be engaged with a ratchet 480. When the electronic component is gripped by the outer and inner presses 447 and 448 after the front ends of the mount 31 on the pallet 4 are lifted and positioned by a push rod 492 which will be described later, the bell crank 476 is put under ratchet operation, associating with the push rod 492, to put the inner press 447 under ratchet operation under which the inner press 447 holds the electronic component. The slider 460, slidable up and down to drive the presses, is provided with a pin 481 for releasing the bell crank 476 from the ratchet 480.

FIGS. 40 and 41 show the detail of the lower end of the rod 432 which is attached, freely slidable up and down, to the body 430. The lower end of the push rod operating rod 432 is formed as a tapered cam 490, as shown in FIG. 41, and the push rod 492 is passed through a block 491 fixed to the tapered cam 490 and urged downward by a tension spring 493. More specifically, a block 493A which is guided, freely slidable up and down, by the rod 432 is urged downward by the spring 493, so that the push rod 492 which is contacted with the lower end of a block 493B can be pushed down by the block 493B which is associated with the block 493A. The rod 432 is urged upward by a tension spring 494, as shown in FIG. 36.

As shown in FIGS. 40 and 42, a pair of component positioning levers 495 are pivoted on the lower end of the body 430. A positioning bolt 497 which is contacted with the leaf spring stopper 408 arranged on the side of the pallet 4 is arranged at the front end of each of the levers 495, while a roller 498 which is contacted with the tapered cam 490 is arranged at the back end of each of the levers 495. A tension spring 499 is interposed between the paired levers 495 to urge them outward. Reference numeral 510 represents a stopper which defines the inclination of the mount 31 arranged on the pallet 4.

Figure 47:
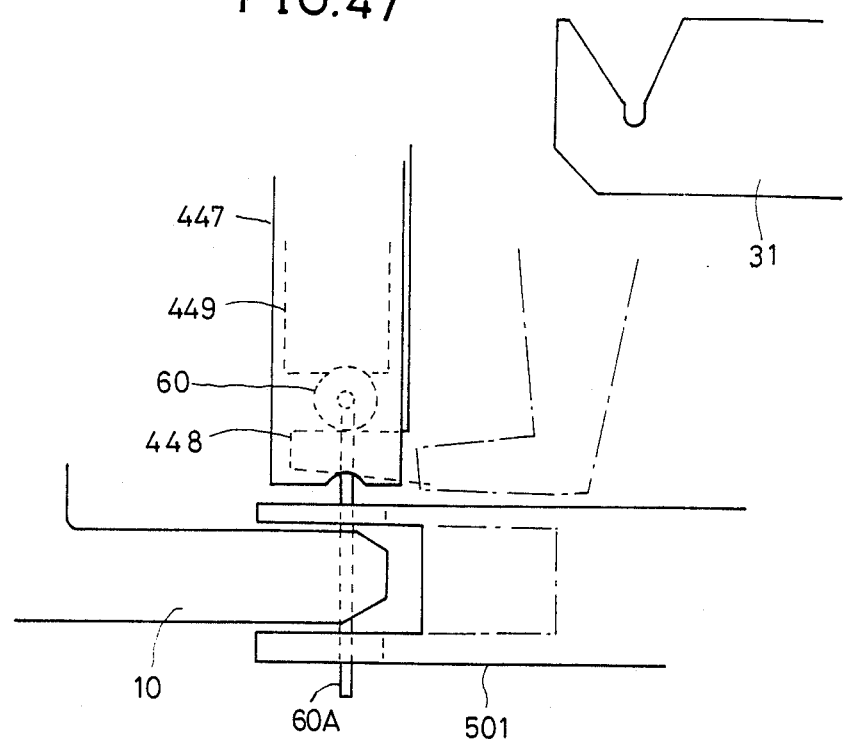
Figure 48:
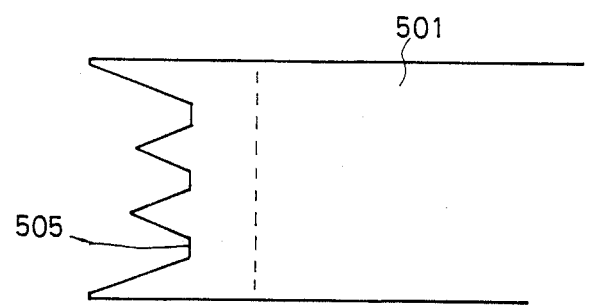
FIG. 48 is a plan view showing a positioning pawl.

As shown in FIG. 33, a slider 500, freely slidable in horizontal direction, is arranged passing through the lower portion of the body 430 of each of the re-forming units 421. A positioning pawl 501 shown in FIGS. 36, 47 and 48 is fixed to the front end of the slider 500 and a roller 502 which is engaged with the cam groove 425C in the cylindrical cam 425 is arranged at the back end of the slider 500.

When the pallet 4 which holds the coaxial lead type electronic component 60 travels along the arc path which is opposite to the chuck 10, and reaches the point A in FIG. 32, the coaxial/radial changeover air cylinder 440 is extended and the re-forming unit 421 is driven by the push rod driving cam 439 and the cylindrical cam 425, thereby causing the push rod operating rod 432 of the re-forming unit 421 positioned at the point A to be pushed down by the lever 433 which is rendered operative by the push rod driving cam 439. As the result, the mount 31 on the pallet 4 on which the coaxial lead type electronic component 60 has been mounted is pushed down, as shown by a dot-and-dash line in FIG. 40, at the back end thereof by the push rod 492, causing the front ends thereof to be lifted. The front ends 408A of the leaf spring stopper 408 arranged on the side of the pallet 4 are thus lifted, as shown in FIG. 42. On the other hand, the tapered cam 490 is lowered at the same time, as shown in FIG. 41, to operate the paired component positioning levers 495, so that the interval between the front ends 408A of the leaf spring stopper 408 can be set to a predetermined value by the positioning bolts 497, as shown in FIG. 42, to position the coaxial lead type electronic component 60. The inner press 448 is then moved in the final operation course of the push rod operating rod 432 to grip the coaxial lead type electronic component 60. The head 431 of the re-forming unit 421 is retreated at this time and the outer and push presses 447 and 449 are at their lifted positions, as shown in FIG. 36.

Figure 43:
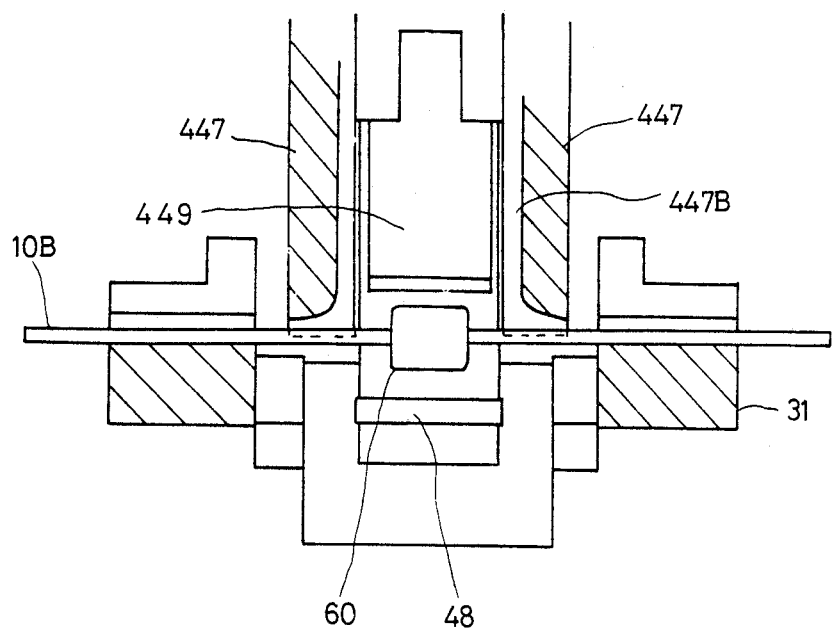
FIG. 43 is a sectional side view showing a state under which the coaxial lead type electronic component held by the component receiving jig is to be received by the outer, inner and push presses.
Figure 44:
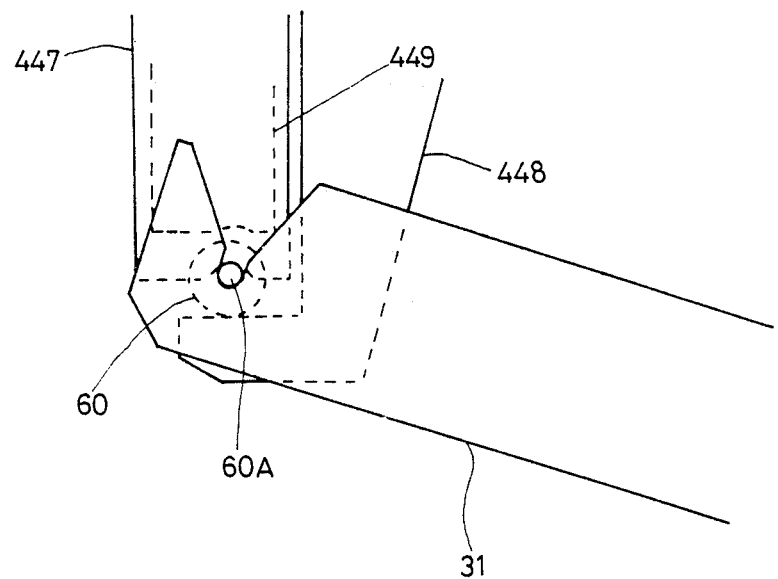
FIGS. 44 through 47 are front views showing the operation of the outer, inner and push presses.
Figure 45:
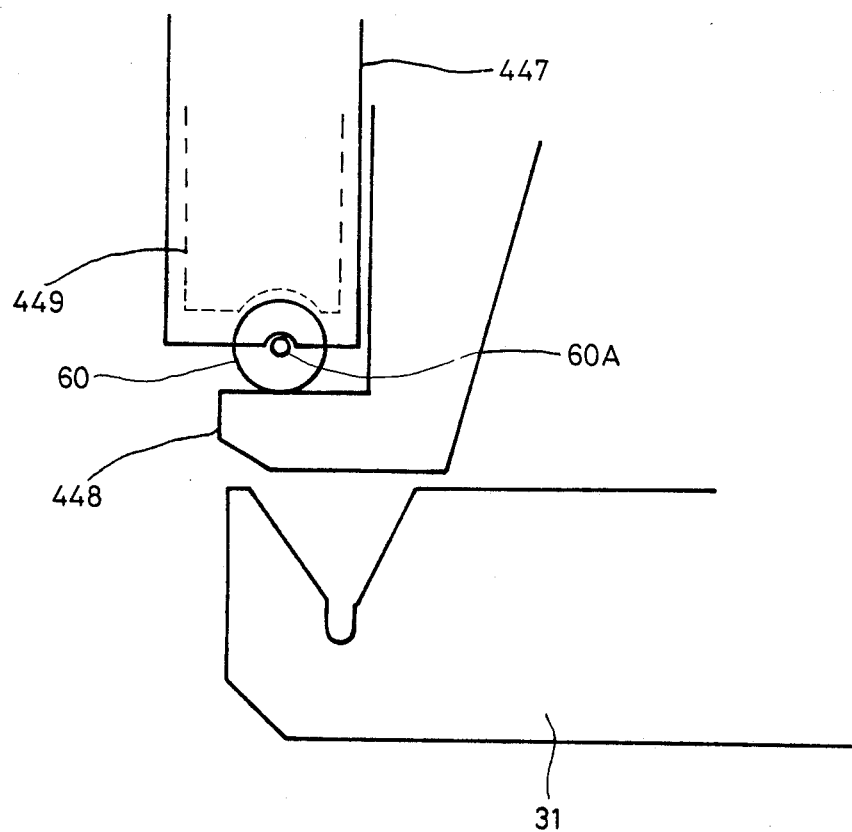

The coaxial lead type electronic component 60 is thus exactly positioned and contacted with the lower ends of the outer press 447, as shown in FIG. 43. The electronic component 60 is then held between the outer press 447 and the front end of the inner press 448, as shown in FIG. 44. Thereafter, the push rod 492 and the tapered cam 490 are returned to their original positions, while the mount 31 on the pallet 4 and the leaf spring stopper 408 are also returned horizontal. The coaxial lead type electronic component 60 is thus shifted from the pallet 4 to the head 431 of the re-forming unit 421, as shown in FIG. 45.

Figure 46:
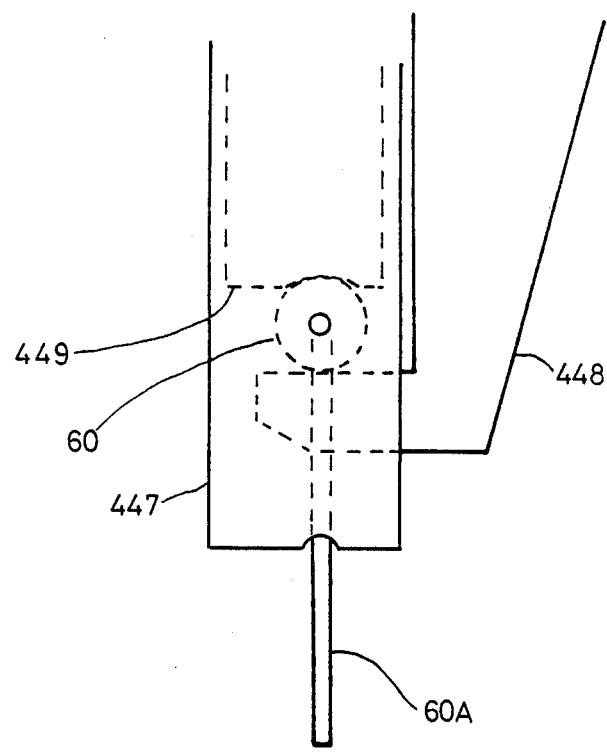

The re-forming unit 421 which holds the coaxial lead type electronic component 60 by the outer and inner presses 447 and 448 reaches the point B in FIG. 32, following the intermittent rotation of the index table 422 on which the re-forming unit 421 is mounted. The coaxial/radial changeover air cylinder 457 is extended at the point B, the head lifting slider 450 is forwarded by the action of the cam groove 425A in the cylindrical cam 425, and the head 431 which is connected to the body 430 through the parallel links 445 and 446 is forwarded and lowered, as shown by a dot-and-dash line in FIG. 32. This is because the mount 31 on the pallet 4 is left undisturbed in the course of re-forming the leads of the coaxial lead type electronic component. Keeping pace with this movement of the head 431, the press driving slider 460 is lifted to lower the outer and push presses 447 and 449 relative to the inner press 448, so that the leads 60A of the coaxial lead type electronic component 60 can be re-formed to the ones of the radial lead type electronic component, as shown in FIG. 46.

Namely, the leads 60A are bent along re-forming grooves 447B each formed on the inner side of each of the lower ends of the outer press 447, as shown in FIG. 43.

When the re-forming unit 421 reaches a point C where it is opposed to the chuck 10, following the intermittent rotation of the index table 422, the slider 500 which is then still at its retreated position is forwarded by the action of the cam groove 425C in the cylindrical cam 425 and the positioning pawl 501 which has V-shaped grooves 505 shown in FIG. 48 is engaged with the leads 60A which have been re-formed to those of the radial lead type electronic component as shown in FIG. 47, to thereby exactly define the interval between the leads. The chuck 10 grips the thus-reformed leads 60A under this state. Thereafter, the pawl 501 returns to its retreated position, the outer and push presses 447 and 449 to their lifted positions, and the inner press 448 to its retreated position, respectively.

Following the rotation of the index table 422, the re-forming unit 421 which has shifted the electronic component to the chuck 10 reaches a point D in FIG. 32 where the lowered head 431 returns to its lifted position.

Effects achieved by the above-described lead re-forming means which is intended to re-form the coaxial lead type electronic components are as follows:

(1) Even in the case where the pallets are used for both of the axial and radial lead type electronic components, only those pallets which which transfer the coaxial lead type electronic components can be selected to bend and re-form their components to the ones of the radial lead type, thereby realizing an automatic insertion apparatus suitable for both of the coaxial and radial lead type electronic components. (2) The re-forming units 421 are arranged, corresponding to and synchronizing with the pallets 4, respectively, and the operation of bending and re-forming the leads of the coaxial lead type electronic component 60 to those of the radial lead type can be completed while the pallet 4 repeats its intermittent travel several times, thereby enabling the automatic insertion apparatus to be speeded up more highly, as compared with the case where the bending and re-forming operation is carried out at one position where the pallet is opposed to the chuck 10. (3) Bending and re-forming of the leads of the coaxial lead type electronic components can be achieved more exactly and reliably. In addition, component delivery to the chucks 10 and the like can also be achieved with higher reliability.

The radial lead type electronic component piece 50 held on the pallet 4 is caused to change its attitude on the pallet 4 when it is shifted from the radial lead type electronic component supply unit 5A shown in FIG. 3 and because of vibration in its travelling course. For the purpose of eliminating this undesired change of its attitude on the pallet, means 43 for correcting the position of the radial lead type electronic components is arranged at a position prior to the position Z where the component is shifted to the chuck 10 of the circulating chuck mechanism 11, as shown in FIG. 1, and the detail of this correction means 43 will be shown in FIGS. 49 through 52.

In FIGS. 49 through 52, a pair of guide bars 630A and 630B are fixedly supported on the body by a support leg 631 along the straight pallet travelling path. Inner faces of these paired guide bars 630A and 630B opposed to each other have correction faces 632, respectively, for defining the leads 50B of the radial lead type electronic component piece 50, which is held vertical by the holder 21 on the pallet 4, at a predetermined position on a horizontal plane. More specifically, the interval between the guide faces 632 between which the radial lead type electronic component piece 50 on the coming pallet 4 is received is made larger at the front of the paired guide bars than the predetermined value, and it becomes smaller as the pallet 4 is intermittently forwarded in a direction X, to finally become equal to the predetermined exactly-defined interval at the back of the paired guide bars. In addition, the underfaces of the paired guide bars 630A and 630B are formed as correction guide faces for defining the height of the top of the tape 50A of the radial lead type electronic component piece 50. The correction faces 633 is upwardly tapered at the front end portions thereof to contact the tape top of the radial lead type electronic component piece 50 which is held a little floated from the holder 21 on the coming pallet 4, and push it down.

On the other hand, arranged at the back ends of the paired guide bars 630A and 630B is a member 635 for mechanically pushing down the tape top of the radial lead type electronic component piece 50. The push-down member 635 is fixed to the underside of a lift plate 637 which is actuated by an air cylinder 636, which is attached to an air cylinder attaching plate 638 fixed to the support leg 631, and a stopper 639 is attached to the lift plate 637, passing through the air cylinder attaching plate 637. The stopper 639 serves to exactly define the lowering amount of the lift plate 637 by means of a nut 641 screwed onto a bolt 640.

Figure 49:
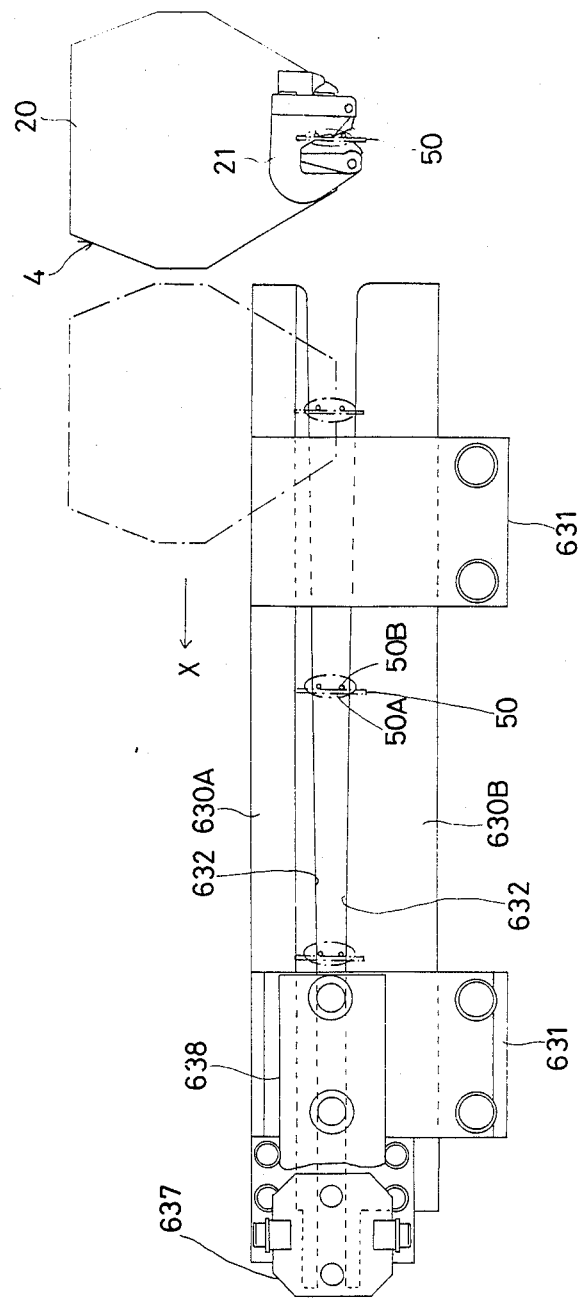
FIG. 49 is a plan view showing a mechanism for correcting the position of the electronic component.
Figure 50:
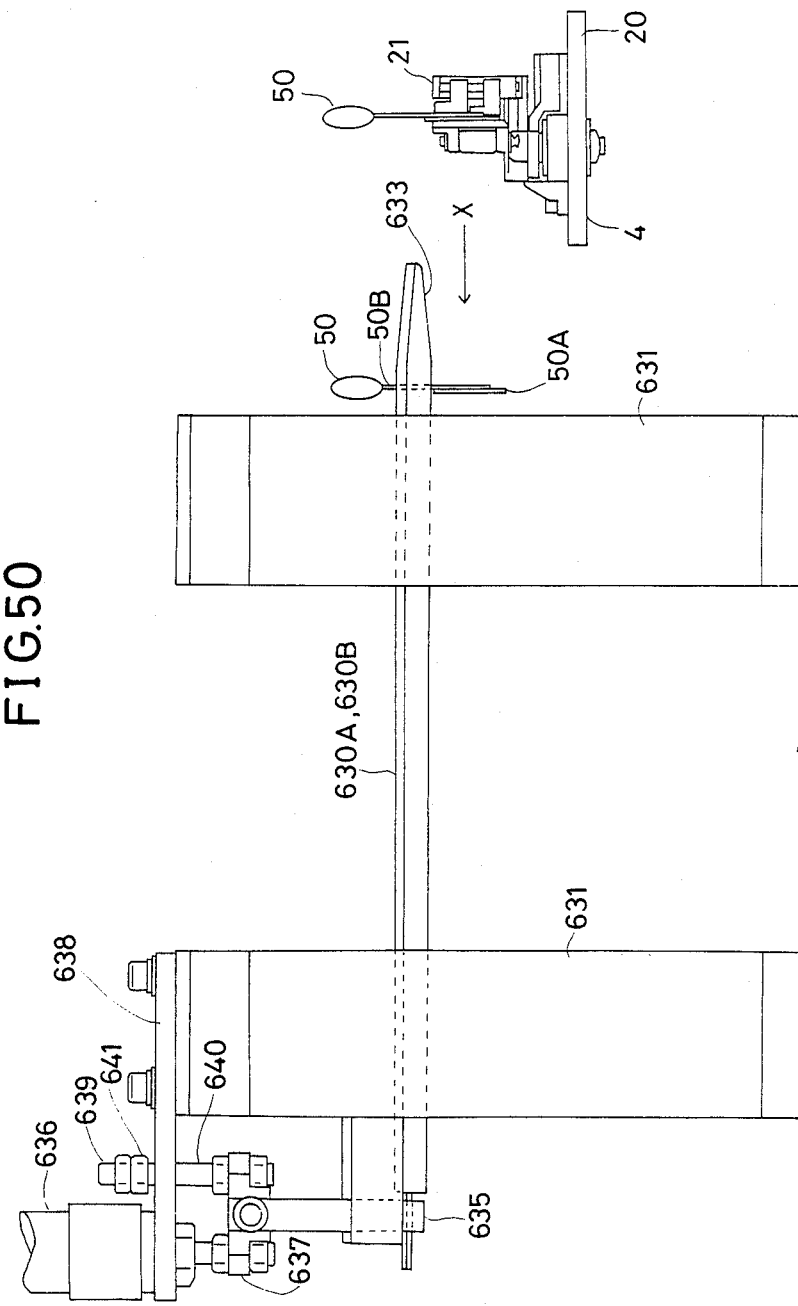
FIG. 50 is a side view showing the correction mechanism in FIG. 49.
Figure 51:
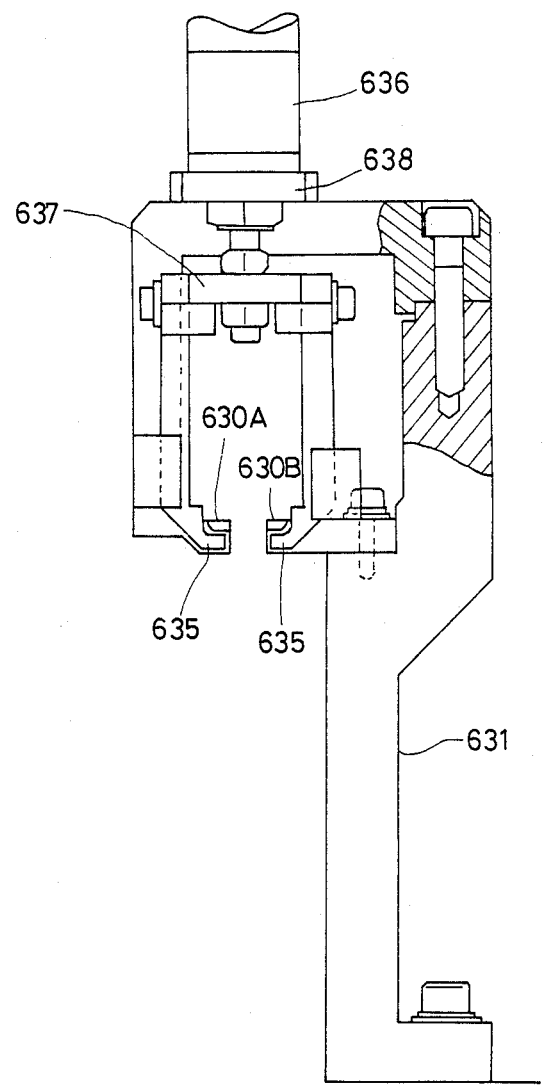
FIG. 51 is a front view showing a push-down member lifted.
Figure 52:
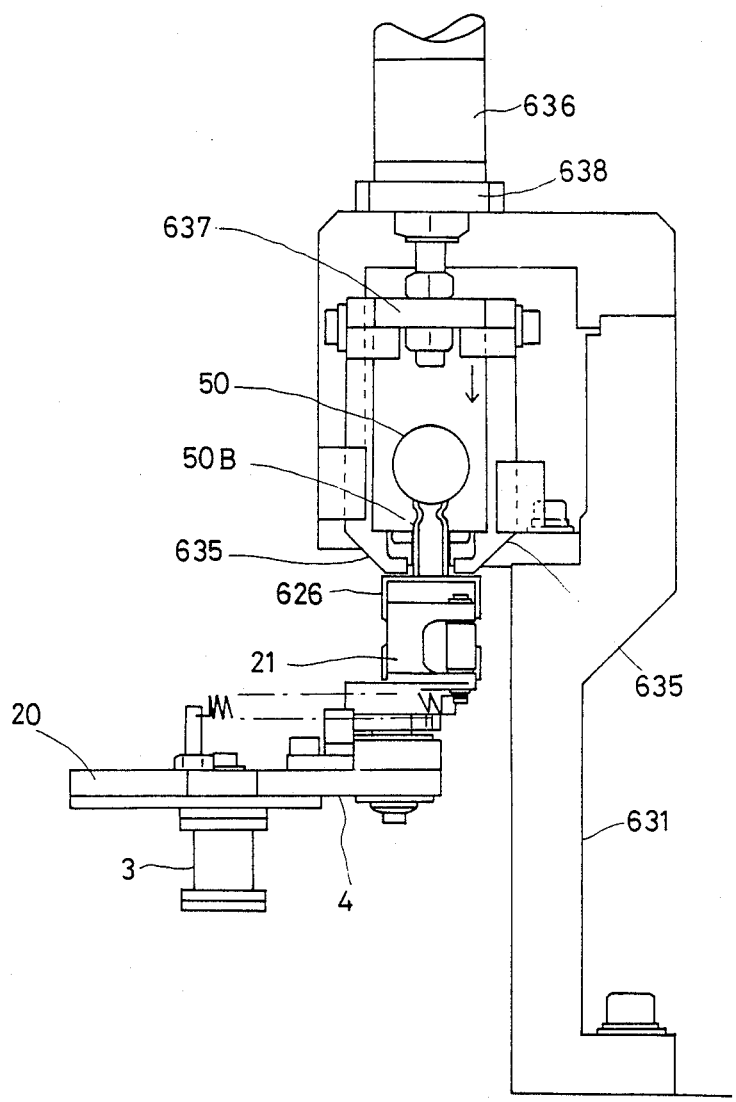
FIG. 52 is a front view showing the push-down member lowered.

As shown in FIGS. 1 and 3, the pallet 4 which has received the radial lead type electronic component piece 50 from the component supply unit 5A travels to the component shift position Z where the component is shifted to the circulating chuck mechanism 11, following the intermittent travel of the chain 3, and it reaches at first the correction means 43 arranged prior to the position Z. The horizontal position (or position in a direction perpendicular to the pallet travelling direction X) of the leads 50B of the radial lead type electronic component piece 50 is exactly defined by the guide faces 632 of the paired guide bars 630A and 630B, as shown in FIGS. 49 and 50, while the top height of the tape 50A of the radial lead type electronic component piece 50 is defined by the correction guide faces 633 at the same time. These operations are carried out while the pallet 4 is intermittently travelling in the direction X. When the pallet 4 arrives and stops at the back ends of the guide bars 630A and 630B after the leads 50B and the tape 50A of the radial lead type electronic component piece 50 are defined like this, the air cylinder 636 is operated, causing the paired push-down members 635 to be lowered from its lifted position shown in FIG. 51 to its lowered position shown in FIG. 52, so that the tape of the radial lead type electronic component piece 50 can be pushed down to strike the bottom of the hodler 21 on the pallet 4 at the lower end thereof. This forcedly pushing-down operation can reliably solve the irregular attitude of the tape which cannot be eliminated by static guide, and it can also make uniform the height of the tapes 50A. After the horizontal position of the leads 50B and the height of the tape 50A are exactly defined like this about the radial lead type electronic component piece 50 on the holder 21 of the pallet 4, the pallet 4 reaches the component shift position Z where the electronic component piece 50 on the pallet 4 is reliably picked up by the chuck 10 of the circulating chuck mechanism 11.

Effects achieved by the above-described correction means are as follows:

(1) The system wherein the position of the electronic component piece 50 on the pallet 4 is corrected by the paired guide bars 630A and 630B which are provided with the horizontal position correcting faces 632 and the vertical position correcting faces 633, respectively, can be made simpler and be operated with higher reliability.

(2) The paired push-down members 635 which are forcedly lifted up and down by the air cylinder 636 are arranged at the back ends of the paired guide bars 630A and 630B to forcedly push down the top of the tape 50A of the radial lead type electronic component piece 50. Therefore, the irregular attitude of the tapes which cannot be eliminated by static guide can be solved with higher reliability and the height of the tapes 50A can be more exactly made uniform.

(3) The correction means has less movable members and it is simpler in construction, thereby making its cost lower and its mechanical fault rarer.

(4) Effects cited in the above items (1) and (2) make it possible to prevent any error caused when the components are shifted to the chucks 10 of the circulating chuck mechanism. It is therefore possible to make extremely rare the component insertion error caused when the components are inserted into the final printed circuit board in the automatic insertion apparatus.

Although the present invention has been described with reference to preferred embodiments thereof illustrated in the accompanying drawings, it should be understood that various changes and modifications can be made by those skilled in the art without departing from the scope of the present invention.

We claim:

1. In a machine for processing and inserting electronic components having leads from electronic component web carriers into lead receiving openings in a printed circuit board, supply and transfer means for supplying radial lead type electronic components each having leads at a first position and transferring said radial lead type electronic components to a second predetermined position, said supply and transfer means comprising a plurality of pallets, each for receiving the holding one of said radial lead type electronic components and each of said pallets having a pallet base and component holding means comprising a holder mounted on said pallet base to be turnable with respect to said pallet base for gripping a radial lead type electronic component;

endless conveying means for conveying said pallets between said first position and said second position in an intermittent fashion on a substantially horizontal plane;

supply means for supplying a piece, which has been cut off and separated from the electronic component web carrier to have a radial lead type electronic component thereon, to the component holding means at the first position; and means for keeping a face of said separated piece substantially perpendicular to a pallet travelling direction and the leads substantially vertical to the horizontal plane.

2. A machine according to claim 1 further including attitude control means for rotating by about 90° on the horizontal plane at the second position the component holding means, which grips the radial lead type electronic component, to hold the face of said separated piece substantially parallel to the pallet travelling direction and again rotating the component holding means on the way, on which the pallet passes over the second position and returns to the first position, to return the attitude of said component holding means to its original one at the first position.

3. A machine according to claim 1 wherein said supply means includes a horizontally-moving slider freely slidable in a direction substantially perpendicular to the pallet travelling direction and having a front end arranged opposite to the pallet travelling direction, a pitch feed unit fixed on the slider and serving to feed the radial lead type electronic web carrier by a certain length for every one time operation of a first pneumatic cylinder, a second pneumatic cylinder for forwarding the slider, and detector means for detecting that the slider is at its forwarded position, and wherein the first cylinder is rendered operative after the detector means detects that the slider is located at its forwarded position by the second cylinder.

4. A machine according to claim 2 wherein said attitude control means includes a ratchet mechanism arranged on the pallet and serving to define the rotating position of said component holding means from the first position to the second position, cam means arranged along the pallet travelling path adjacent to the second position and contacting the component holding means to change the rotating position of said component holding means from the first position to the second position, and a release mechanism arranged along the pallet travelling path between the second and first positions and serving to release the ratchet mechanism to return the rotating position of said component holding means to its original one at the first position.

5. A machine according to claim 1 further including means for correcting the position of said radial lead type electronic component and arranged along the path on which the pallet travels from the first position to the second position wherein said position correcting means includes a pair of guide members and a push-down member located at the ends of the guide members to push down the top end of said separated piece of the radial lead type electronic component and wherein inner faces of said guide members, opposite to each other, are formed as horizontal position correcting guide faces for defining the radial lead type electronic component on said component holding means in horizontal direction.

6. In a machine for processing and inserting electronic components having leads from electronic component web carriers into lead receiving openings in a printed circuit board, supply and transfer means for supplying coaxial lead type electronic components to a second predetermined position, said supply and transfer means comprising a plurality of pallets, each for receiving and holding one of said coaxial lead type electronic components and each of said pallets having a pallet base and a component receiving mounting member arranged on said base to be freely movable up and down at a front end thereof on the pallet base and serving to support a coaxial lead type electronic component substantially horizontally and parallel to a pallet travelling direction;

endless conveying means for conveying said pallets between said first position and said second position in an intermittent fashion on a substantially horizontal plane; and supply means for supplying said coaxial lead type electronic components to said pallets at said first position.

7. A machine according to claim 6 wherein said supply means includes a pair of drive wheels fixed to an intermittently-rotating shaft, a pair of follower wheels pivoted, freely rotatable, at a position which is separated by a certain interval from the paired drive wheels, a feed belt stretched between a belt-wound portion of said drive wheel and the follower wheel and contacting the coaxial lead type electronic component web carrier to feed the carrier, a cutter mechanism for cutting off the leads from the web carrier, and a push rod for lifting the front ends of said component receiving mounting member, which receive a coaxial lead type electronic component cut off from the web carrier by the cutter mechanism, toward the drive wheels.

8. A machine according to claim 6 futher including lead re-forming means arranged at said second position and serving to re-form the leads of said coaxial lead type electronic component to those of the radial type wherein said lead re-forming means has a plurality of re-forming units arranged along the pallet travelling path, corresponding to the pallets and synchronous with the intermittent travel of said pallets and each of the re-forming units having outer, inner and push presses by which the leads of said coaxial lead type electronic component are re-formed to those of the radial lead type.

9. In a machine for processing and inserting electronic components having leads from electronic component web carriers into lead receiving openings in a printed circuit board, supply and transfer means for selectively supplying radial lead type electronic components and coaxial lead type electronic components at a first position and transferring said radial lead type electronic components and coaxial lead type electronic components to a second predetermined position, said supply and transfer means comprising a plurality of pallets, each for receiving and holding one of said radial and coaxial lead type electronic components and each of said pallets having a pallet base, component holding means having a holder mounted on said pallet base to be turnable with respect to said pallet base for gripping a radial lead type electronic component, and a component receiving mounting member arranged on said pallet base to be freely movable up and down at front ends thereof on the pallet base and serving to support a coaxial lead type electronic component substantially horizontally and parallel to a pallet travelling direction;

endless conveying means for conveying said pallets between said first position and said second position in an intermittent fashion on a substantially horizontal plane;

supply means for supplying a separated piece of the radial lead type electronic component, which is cut off from the electronic component web carrier, to the component holding means at the first position;

means for keeping a face of said separated piece substantially perpendicular to the pallet travelling direction and leads of said separated piece substantially vertical to the horizontal plane; and attitude control means for rotating by about 90° on the horizontal plane at the second position the component holding means, which grips the radial lead type electronic component, to hold the face of said separated piece substantially parallel to the pallet travelling direction and again rotating the component holding means on the way on which the pallet passes over the second position and returns to the first position, to return the attitude of said component holding means to its original one at the first position.

10. A method of supplying and transferring electronic components, said method comprising the steps of supplying an electronic component web carrier composed of radial lead type electronic components arranged in a row;

cutting said electronic component web carriers to form separated pieces each having one radial lead type electronic component;

supplying said separated pieces one by one onto respective pallets at a first position, keeping a face of said separated piece substantially vertical to the pallet travelling direction and the leads of the radial lead type electronic component substantially vertical to horizontal plane;

transferring each pallet on which the separated piece is mounted to a second predetermined position in an intermittent fashion on a substantially horizontal plane, during which the separated piece is rotated by about 90° on the horizontal plane to hold its face substantially parallel to the pallet travelling path; and delivering said separated piece, when the pallet conveyed to said second position holds said separated piece of the radial lead type electronic component, from said pallet to an inserting assembly directly at said second position, while holding the leads of said component.

11. The machine of claim 6, wherein said each pallet additionally comprises a support fixed onto said pallet base, a pivot pin mounted upon said support, with said mounting member pivotally mounted through said pivot pin, and wherein said mounting member comprises a pair of arms each having a substantially V-shaped recess for receiving leads of the axial lead-type component, and additionally comprising an expansion spring connected with said mounting member and said support for maintaining said mounting member substantially horizontal, and a leaf spring engaged with said pivot pin and said mounting member for urging the front end thereof upwardly.

12. The machine of claim 1, wherein said holder on each said pallet additionally comprises a substantially vertical rod portion mounted at a fulcrum thereof onto said pallet base, a fixed holder guide integrally mounted thereon, a pair of retaining claws situated to be forced against a face of said holder guide and pivotally mounted upon a rod, spring means for urging said claws against said guide, a roller situated on a front end portion of an outer face of said fixed holder guide, and an expansion spring connecting said pallet base and said holder for biasing said holder in a clockwise direction.

* * * * *